(12) United States Patent
Bhandari et al.

(10) Patent No.: US 10,355,148 B2
(45) Date of Patent: Jul. 16, 2019

(54) IRON PYRITE NANOCRYSTAL FILM AS A COPPER-FREE BACK CONTACT FOR POLYCRYSTALLINE CDTE THIN FILM SOLAR CELLS

(71) Applicant: The University of Toledo, Toledo, OH (US)

(72) Inventors: Khagendra Bhandari, Toledo, OH (US); Randy J. Ellingson, Toledo, OH (US); Rajendra R. Khanal, Toledo, OH (US)

(73) Assignee: The University of Toledo, Toledo, OH (US)

( * ) Notice: Subject to any disclaimer, the term of this patent is extended or adjusted under 35 U.S.C. 154(b) by 222 days.

(21) Appl. No.: 15/116,629

(22) PCT Filed: Feb. 10, 2015

(86) PCT No.: PCT/US2015/015202
§ 371 (c)(1),
(2) Date: Aug. 4, 2016

(87) PCT Pub. No.: WO2015/167647
PCT Pub. Date: Nov. 5, 2015

(65) Prior Publication Data
US 2016/0351736 A1 Dec. 1, 2016

Related U.S. Application Data

(60) Provisional application No. 61/937,992, filed on Feb. 10, 2014.

(51) Int. Cl.
*H01L 31/02* (2006.01)
*H01L 31/032* (2006.01)
(Continued)

(52) U.S. Cl.
CPC ............ *H01L 31/022425* (2013.01); *H01L 31/02008* (2013.01); *H01L 31/0296* (2013.01);
(Continued)

(58) Field of Classification Search
CPC .......... H01L 31/022425; H01L 31/073; H01L 31/0296; H01L 31/0392; H01L 31/03925;
(Continued)

(56) References Cited

U.S. PATENT DOCUMENTS 4,207,119 A * 6/1980 Tyan ................. H01L 31/073
136/258
2007/0163635 A1* 7/2007 Nasuno ............. H01L 31/068
136/252

(Continued)

OTHER PUBLICATIONS

Bastola, Application of composition controlled nickel-alloyed iron sulfide pyrite nanocrystal thin films as the hole transport layer in cadmium telluride solar cells, Journal of Materials Chemistry C, 2017.

(Continued)

*Primary Examiner* — Lindsey A Bernier
(74) *Attorney, Agent, or Firm* — MacMillan, Sobanski & Todd, LLC

(57) ABSTRACT

The invention discloses nanocrystalline (NC) $FeS_2$ thin films as the back contact for CdTe solar cells. In one example, the $FeS_2$ NC layer is prepared from a solution directly on the CdTe surface using spin-casting and chemical treatment at ambient temperature and pressure, without a thermal treatment step. Solar cells prepared by applying the NC $FeS_2$ back contact onto CdTe yield efficiencies of about 95% to 100% that of standard Cu/Au back contact devices. In another example, $FeS_2$ is interposed between Cu and Au to (Continued)

form a Cu/FeS$_2$ NC/Au back contact configuration yielding an efficiency improvement of 5 to 9 percent higher than standard Cu/Au devices.

21 Claims, 16 Drawing Sheets
(15 of 16 Drawing Sheet(s) Filed in Color)

(51) Int. Cl.
*H01L 31/073* (2012.01)
*H01L 31/0224* (2006.01)
*H01L 31/0296* (2006.01)
*H01L 31/0392* (2006.01)

(52) U.S. Cl.
CPC ........ *H01L 31/022441* (2013.01); *H01L 31/022466* (2013.01); *H01L 31/032* (2013.01); *H01L 31/03925* (2013.01); *H01L 31/073* (2013.01); *Y02E 10/543* (2013.01)

(58) Field of Classification Search
CPC ......... H01L 31/0445; H01L 31/022466; Y02E 10/50; Y02E 10/543
See application file for complete search history.

(56) References Cited

U.S. PATENT DOCUMENTS

2010/0229931 A1* 9/2010 Reddy ............ H01L 31/022425
136/255
2011/0240108 A1* 10/2011 Law .................. B82Y 30/00
136/255

OTHER PUBLICATIONS

Gao, Preparation of vanadium diselenide thin films and their application in CdTe solar cells, Thin Solid Films, vol. 550 (2014), pp. 638-642.

Kinner, Majority Carrier Type Control of Cobalt Iron Sulfide (Co$_x$Fe$_{1-x}$S$_2$) Pyrite Nanocrystals, J. Phys. Chem. C, 2016.

Kraft, Alternative back contacts for CdTe solar cells: a photoemission study of the VSe$_2$/CdTe and TiSe$_2$/CdTe interface formation, Thin Solid Films, vol. 431-432 (2003), pp. 382-386.

* cited by examiner

| Hydrazine treatment | Temperature (°C), time (hour) | 2θ (°) | FWHM (rad) | Grain size (Å) |
|---|---|---|---|---|
| No | Room temp | 33.02391 | 0.00771 | 185.5 |
| Yes | Room temp | 33.02168 | 0.00793 | 180.3 |
| Yes | 500, 1 | 33.03124 | 0.00694 | 206.1 |
| Yes | 500, 3 | 33.04121 | 0.00675 | 211.9 |
| No | 500, 3 | 33.03592 | 0.00695 | 205.6 |
| Yes | 540, 1 | 33.03096 | 0.00628 | 227.6 |
| Yes | 540, 3 | 33.02866 | 0.00611 | 234.1 |

| Synthesis of FeS$_2$ | Conditions | | 4-point probe measurement | |
|---|---|---|---|---|
| Surfactant/solvent | Hydrazine treatment | Heat treatment | Sheet Resistance ($\Omega$/sq.) | Resistivity ($\Omega$*cm) |
| 1,2-hexanediol/OLA | No | No | $3.4 \times 10^5$ | 119 |
| | Yes | No | $3.5 \times 10^4$ | 12.2 |
| | Yes | Yes | $6.3 \times 10^3$ | 2.2 |
| TOPO/OLA | No | No | $3.8 \times 10^5$ | 133 |
| | No | Yes | $7.4 \times 10^3$ | 2.6 |
| | Yes | No | $3.4 \times 10^4$ | 11.9 |
| | Yes | Yes | $1.5 \times 10^3$ | 0.52 |

FIGURE 7

| Synthesis | Conditions | | Hall Measurements | | | |
|---|---|---|---|---|---|---|
| Surfactant/Solvent | Hydrazine treatment | Heat treatment | Sheet Resistance ($\Omega$/□) | Carrier conc. (cm$^{-3}$) | Resistivity ($\Omega$*cm) | Mobility (cm$^2$/Vs) |
| TOPO/OLA | No | Room temp | $1.1 \times 10^5$ | $4.3 \times 10^{18}$ | 139 | 0.04 |
| | Yes | Room temp | $3.8 \times 10^4$ | $9.7 \times 10^{18}$ | 13.3 | 0.22 |
| | Yes | 500C, 1h | $4.3 \times 10^3$ | $1.5 \times 10^{19}$ | 1.5 | 0.32 |
| | Yes | 500C, 3h | $1.8 \times 10^3$ | $3.5 \times 10^{19}$ | 0.6 | 0.37 |
| | No | 500C, 3h | $4.9 \times 10^3$ | $1.6 \times 10^{19}$ | 1.7 | 0.22 |
| | Yes | 540C, 1h | $3.0 \times 10^3$ | $3.4 \times 10^{19}$ | 1.1 | 0.17 |
| | Yes | 540C, 3h | $1.8 \times 10^3$ | $5.7 \times 10^{20}$ | 0.6 | 0.42 |

FIGURE 8

| Contact | $V_{OC}$ (volt) | $J_{SC}$ (mA cm$^{-2}$) | FF (%) | Efficiency (%) | $R_S$ ($\Omega \cdot cm^2$) |
|---|---|---|---|---|---|
| Au | 0.655 ±0.03 | 20.8 ±0.4 | 62.8±1.3 | 8.6±0.5 | 6.0±0.9 |
| Cu/Au | 0.787±0.02 | 21.8±0.7 | 65.1±1.9 | 11.2±0.9 | 5.2±1.0 |
| FeS$_2$/Au | 0.753 ±0.004 | 22.1 ±0.5 | 61.4±0.7 | 10.2±0.5 | 6.8±0.9 |
| After heat treatment (100 °C in nitrogen gas for 23 hours) | | | | | |
| Au | 0.521±0.02 | 20.1±0.3 | 61.4±1.4 | 6.4±0.8 | 6.2±1.1 |
| Cu/Au | 0.767±0.05 | 20.3±0.5 | 63.6±0.9 | 9.9±0.6 | 6.1±1.0 |
| FeS$_2$/Au | 0.739±0.005 | 21.9±0.8 | 60.2±1.1 | 9.8±0.5 | 8.8±1.2 |

| highest performance device | | | | | | |
|---|---|---|---|---|---|---|
| BC | $V_{OC}$ (V) | $J_{SC}$ (mA cm$^{-2}$) | FF (%) | PCE (%) | $R_S$ (Ω cm$^2$) | $R_{SH}$ (Ω cm$^2$) |
| Cu/Au | 0.227 | 21.9 | 45.3 | 2.3 | 4.3 | 25.2 |
| FeS$_2$NC/Au | 0.777 | 22.3 | 60.7 | 10.5 | 7.9 | 1830 |
| Average parameters | | | | | | |
| Cu/Au (15) | 0.188±0.04 | 21.5±0.4 | 41.3±3.8 | 1.7±0.5 | 4.9±0.5 | 15.1±7.2 |
| FeS$_2$NC/Au (23) | 0.734±0.03 | 22.07±0.5 | 52.6±5.0 | 8.6±1.2 | 8.7±1.2 | 897±449 |

IRON PYRITE NANOCRYSTAL FILM AS A COPPER-FREE BACK CONTACT FOR POLYCRYSTALLINE CDTE THIN FILM SOLAR CELLS

This application claims the benefit of PCT/US2015/015202 filed Feb. 10, 2015, which claims priority to U.S. Provisional Application Ser. No. 61/937,992, filed under 35 U.S.C. § 111(b) on Feb. 10, 2014, the disclosure of which is incorporated herein by reference in its entirety.

STATEMENT REGARDING SPONSORED RESEARCH

This invention was made with government support under Grant Number CHE-1230246 awarded by the National Science Foundation and also under Grant Number FA9453-11-C-0253 awarded by the Air Force Research Laboratory. The government has certain rights in the invention.

FIELD OF THE INVENTION

This invention is generally directed to photovoltaic cells. In particular, this invention relates to $FeS_2$ applied as an ohmic or low barrier back contact material to a photovoltaic cell. In one particular aspect of the invention nanocrystalline (NC) $FeS_2$ thin films are applied as the back contact for CdTe solar cells.

BACKGROUND OF THE INVENTION

There is no admission that the background art disclosed in this section legally constitutes prior art.

Photovoltaic cells are devices that convert light energy into electrical energy. Typical photovoltaic cells include a substrate layer for mounting the cell and two ohmic contacts or electrode layers for passing current to an external electrical circuit. The cell also includes an active semiconductor junction, usually comprised of two or three semiconductor layers in series. The two layer type of semiconductor cell consists of an n-type layer and a p-type layer, and the three layer type includes an intrinsic (i-type) layer positioned between the n-type layer and the p-type layer for absorption of light radiation. The photovoltaic cells operate by having readily excitable electrons that can be energized by solar energy to higher energy levels, thereby creating positively charged holes and negatively charged electrons at the interface of various semiconductor layers. The creation of these positive and negative charge carriers applies a net voltage across the two electrode layers in the photovoltaic cell, establishing a current of electricity.

Photovoltaic cells have been produced using a variety of materials for the various functional layers of the cell. In particular, semiconductor layers of alloys using cadmium, tellurium, sulfur, indium, gallium, and even iron are known in the art. For example, iron pyrite (iron persulfide, $FeS_2$) has been tested as a material thought to be suitable for semiconductor layers due, in large part, to its crystal structure and the predicted optical and semiconducting properties associated with that structure. The predicted semiconducting and optical properties of $FeS_2$ are similar to other well-known semiconductor materials, which has directed research efforts toward eliminating observed characteristics of the material that differ from the predicted material properties. For example, efforts have been made to reduce the free-carrier concentrations of the material to lower levels consistent with those of semiconductors. $FeS_2$ exhibits an indirect band gap of 0.95 eV and an absorption coefficient exceeding $10^5$ cm$^{-1}$ for photon energies above 1.3 eV. Previous attempts at creating $FeS_2$-based PV devices have performed poorly compared with devices based on other absorber materials (e.g. CdTe, CIGS, CZTS, perovskites such as methylammonium lead iodide, and PbS quantum dots). These previous efforts were only able to produce a 2.8% efficient photo-electrochemical cell based on single crystal $FeS_2$ electrodes using an iodide/tri-iodide (I—/$I_3$—) redox couple. This poor efficiency for $FeS_2$-based solar cells is based, in part, on challenges presented by high defect densities, likely the result of poor phase and stoichiometry control. Specifically, phase purity is a concern for effective $FeS_2$ photovoltaic devices because the different iron sulfide phases of $Fe_xS_y$ exhibit a wide range of optoelectronic properties.

The ohmic contacts of photovoltaic cells are often configured as front and back contacts. The front electrical contact is a transparent or semi-transparent layer that is electrically conductive and permits light energy to pass through to the semiconductor layers below. The back contact is also electrically conductive but is not necessarily a transparent layer. Back contacts are known to include materials containing copper, gold, zinc, aluminum, and graphite, for example. These materials, however, may be adversely reactive with adjacent semiconductor layers, may pose manufacturing or durability concerns, or may be expensive. Thus, it would be desirable to provide a material for a back contact layer that exhibits suitable electronic properties, elemental abundance, and forms a low-barrier interface allowing positively-charged holes to transfer out of the semiconductor layer, such as the CdTe layer, to the back metal electrode. In particular, it would be desirable to produce a photovoltaic cell formed with a back contact layer from abundant and inexpensive materials, such as a $FeS_2$-based back contact.

SUMMARY OF THE INVENTION

In a first aspect, there is provided herein a photovoltaic cell having an ohmic or low barrier back contact that includes iron pyrite.

In a second aspect, there is provided herein a photovoltaic cell including a front window; a semiconductor layer that includes CdTe; and a back contact layer having an $FeS_2$ nanocrystalline portion. In certain embodiments, the $FeS_2$ nanocrystalline portion is in contact with the CdTe semiconductor layer. In certain embodiments, the semiconductor layer further includes CdS. In yet other certain embodiments, a metal element forms another portion of the back contact. The metal element may be in an elemental form or as a compound or alloy of a metal element. In certain embodiments, the metal element may be one of Au, Cu, Sb, Hg, Bi-telluride, and graphene. In certain embodiments, the $FeS_2$ nanocrystalline portion may be disposed between the CdTe semiconductor layer and the metal element portion of the back contact. In other certain embodiments, the metal may be disposed between the semiconductor layer, such as the CdTe layer, and the $FeS_2$ layer.

In a third aspect, there is provided herein a method of forming a photovoltaic cell that includes the step of applying a $FeS_2$ material onto a semiconductor layer to form an ohmic or low barrier back contact. In certain embodiments of the method, there is included a step of forming a semiconductor layer onto a front contact and applying a layer of $FeS_2$ onto the semiconductor layer. In certain embodiments of the method, the step of forming the semiconductor layer includes the step of forming a CdS semiconductor layer onto the front contact and forming a CeTe semiconductor layer onto the CdS semiconductor layer. In yet other embodiments, the step of forming the $FeS_2$ layer is a step of forming a nanocrystalline ($FeS_2$ NC) layer onto the semiconductor layer by a drop-cast method. In yet other embodiments, the $FeS_2$ layer is formed by an evaporation step, a sputtering step, or a sublimation step. In yet other aspects of these embodiments, the $FeS_2$ layer is synthesized by a step using $FeBr_2$.

In a fourth aspect, there is provided herein a method of forming a photovoltaic cell that includes the steps of forming a front ohmic contact layer onto a front window layer; forming a first semiconductor layer having an n-type characteristic; forming a second semiconductor layer having a p-type characteristic; and forming a back contact having an $FeS_2$ layer onto one of the first and second semiconductor layers. In certain embodiments of the method, the step of forming the front ohmic contact layer is a step of forming a transparent conductive oxide layer and the steps of forming the first and second semiconductor layers are a step of sputtering an n-type CdS semiconductor layer and a step of sputtering a CdTe semiconductor layer. In yet additional embodiments, the step of forming the $FeS_2$ layer is a step of forming an $FeS_2$ nanocrystalline layer. In certain embodiments, the step of forming the $FeS_2$ nanocrystalline layer may include one or more steps of mixing $FeBr_2$ and trioctylphosphine oxide in oleylamine; heating the $FeBr_2$, trioctylphosphine oxide, and oleylamine mixture; preparing a sulfur precursor solution using sulfur and oleylamine; combining the sulfur precursor solution and the $FeBr_2$, trioctylphosphine oxide, and oleylamine mixture; and cooling the sulfur and $FeBr_2$, trioctylphosphine oxide, and oleylamine mixture.

In a fifth aspect of the invention, an $FeS_2$ layer applied as a constituent of the back contact of a photovoltaic cell may provide passivation of pinholes and other shunt-forming defects associated with semiconductor layers. In particular, an embodiment of this aspect of the invention includes a CdS/CdTe semiconductor layer, having known pinhole defects, and a layer of $FeS_2$ in conjunction with a metal such as Cu or Au, to form the back contact. Such a photovoltaic cell yields efficiency and overall electrical performance that is substantially improved over CdS/CdTe cells having pinholes and conventional Cu/Au back contacts.

BRIEF DESCRIPTION OF THE DRAWINGS

The patent or application file may contain one or more drawings executed in color and/or one or more photographs. Copies of this patent or patent application publication with color drawing(s) and/or photograph(s) will be provided by the U.S. Patent and Trademark Office upon request and payment of the necessary fees.

FIG. 7 is a table showing the sheet resistance for two pairs of two different $FeS_2$ NC films on soda-lime glass, each in three different conditions;

FIG. 8 is a table showing Hall Measurements; average thickness of the films=3.5 μm;

DETAILED DESCRIPTION OF THE PREFERRED EMBODIMENT(S)

In a first aspect, there is provided herein an iron pyrite (iron persulfide, FeS$_2$) nanocrystal-based thin film low barrier back contact to CdTe solar cells. While the semiconductor layers are described in the context of CdS and CdTe layers, other materials may be used. For example, the various semiconductor active layers may alternatively be formed from CIGS (copper indium zinc gallium di-selenide), CZTS (copper zinc tin sulfide), CZTSSe (copper zinc tin sulfur selenium alloy), tin sulfide, and copper antimony sulfide. In one embodiment, the FeS$_2$-based back contact can be applied to the cell without pre-treatment of the CdTe p-type film. Creating a low-barrier, ohmic back contact to CdTe often involves addressing both the high work function and the low resistivity of the thin film. Standard back contact preparation often introduces copper, as a thin evaporated layer or as a CuCl$_2$ solution deposition, followed by thermally-assisted diffusion to create a low-resistivity Cu$_x$Te phase. Several studies have shown that Cu diffuses readily, and over time reaches the CdS/CdTe interface, reducing the operating voltage of the device. Copper diffusion therefore serves as a critical pathway to degradation, influencing device performance over the life of a PV system—ultimately degrading the economic performance of the technology. Alleviating the degradation associated with Cu diffusion has advantages for CdTe-based photovoltaic systems.

Iron pyrite exhibits a yellowish metallic luster reminiscent of gold, and is commonly known as Fool's Gold. As-deposited FeS$_2$ NC films, evaluated at room-temperature using four-point probe and Hall-effect measurements, have shown low resistivity of about 100 Ω-cm, high free carrier concentrations of about $10^{19}$ cm$^{-3}$, and a low electron mobility of about $10^{-1}$ cm$^2$V$^{-1}$s$^{-1}$. In addition, FeS$_2$ NCs show strong sub-bandgap optical absorption, indicating the presence of sub-bandgap electronic states arising from core and/or surface defects. Thus, the inventors have concluded that a strong photovoltaic performance would not be expected when using FeS$_2$ as an absorber layer, based on the combination of high free carrier density, low mobility, and mid-gap absorption leading to reduced photovoltage. While not wishing to be bound by theory, the inventors believe that prior poor cell performance, compared with CdTe-based cells, can be attributed, in part, to both strong Fermi level pinning associated with surface states and to bulk defects caused by sulfur deficiency and local variations in crystal structure.

Figure 1:
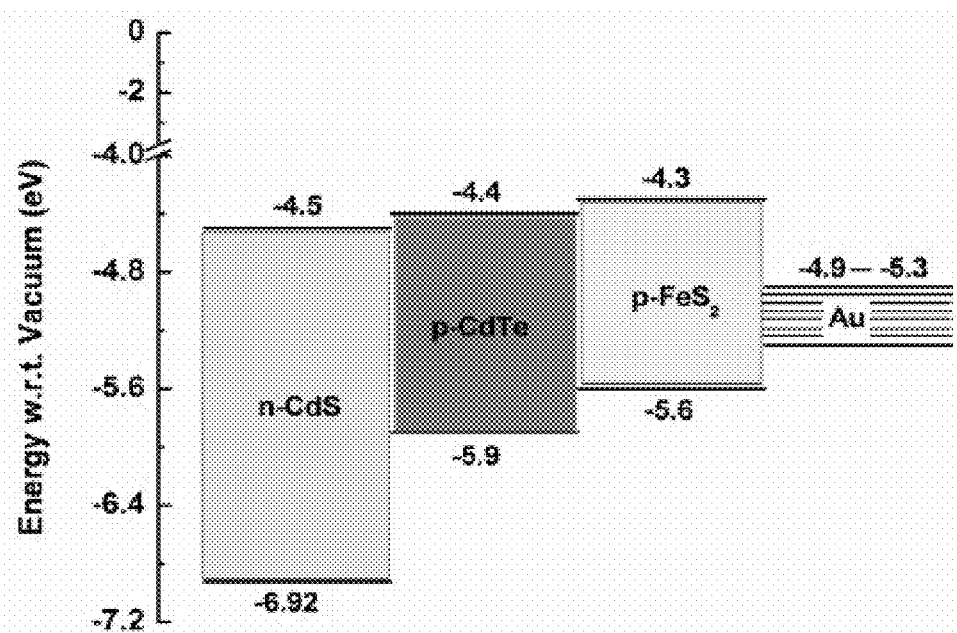
FIG. 1 is a graph of non-equilibrium band diagram showing conduction and valence band positions relative to the vacuum level.

As stated above for CdS/CdTe solar cells, conventional back contacts are commonly made with Cu/Au or Cu/graphite. Copper introduced at the back contact diffuses atomically to the CdS/CdTe junction, resulting in shunting at the n-p junction. The inventors' development of forms of FeS$_2$ as a back contact to CdTe provides a Cu-free and low-cost cell structure. Alternatively, these forms of FeS$_2$ can be used in conjunction with Cu, or other metals, to form an alloyed back contact layer. Such a construction may include orientations where Cu is applied to the FeS$_2$ material and positioned as an outermost back contact layer, Cu is positioned between the FeS$_2$ material and the adjacent semiconductor layer, or the back contact layer is formed from three sublayers as a metal interface with the semiconductor layer adjacent to the FeS$_2$ material and a final metal layer. In addition, it is contemplated by the inventors that, for example, Co$^{2+}$ or Ni$^{2+}$ may substitute for Fe$^{2+}$, and other Group VI elements such as, for example, Se or Te can substitute for S. Further, the inventors contemplate that preparation of the CdTe layer to accept and improve charge transport may involve exposure to an activation agent, such as FeCl$_2$ or FeCl$_3$, in a similar manner that CuCl$_2$ is used, as described above. The inventors have observed that the work function of FeS$_2$ ($\varphi \approx 5.45$ eV) compares favorably with that of Au ($\varphi \approx 5.1$ eV). As shown in the non-interacting band diagram of FIG. 1, the inventors have recognized the possibility of a barrier-less interface using an FeS$_2$-based back contact. The inventors have demonstrated the applicability of such a barrier-less interface in spite of recognizing that charge polarization effects associated with Fermi level equilibration typically introduces band bending. The inventors' recognition of the high free carrier concentration and low resistivity have resulted in FeS$_2$ NC development of a conductive back contact layer. Therefore, despite repeated, failed attempts to use FeS$_2$ as a solar cell absorber layer, the inventors have realized the potential of FeS$_2$ NCs as an ohmic or low barrier contact to CdTe. As used herein, the term "ohmic," in the context of back contact electrical performance, is understood to include both ohmic and near ohmic contacts. As generally understood, ohmic contacts typically have no electronic barrier to the flow of holes at the back contact. Near ohmic contacts may exhibit some retained barrier to hole flow, as may be the case with some (though not all) embodiments of back contacts using FeS$_2$.

In one embodiment of a method of forming a photovoltaic cell having FeS$_2$-based back contact, the inventors have created a solution-based synthesis and deposition process that offers a low-cost and scalable photovoltaic manufacturing method for large glass substrate processes and roll-to-roll processing on flexible substrates. In spite of other routes available to synthesize FeS$_2$ NCs, the inventors have developed this solution-based method, in part due to the use of a thermal injection reaction of an iron salt solution with an elemental sulfur source. Whereas FeCl$_2$ may be used as the iron source, the inventors have developed the method using FeBr$_2$, which yields improved results regarding crystal structure and infrared absorption. In an embodiment of the method, the synthesis of FeS$_2$ NCs, which may be performed in a Schlenk line under N$_2$ environment, begins with about 1.49 mmol of FeBr$_2$ (~321 mg) and 3 mmol of trioctylphosphine oxide (TOPO) (1.16 g), which are mixed in 30 mL of oleylamine (OLA) in a three neck flask under constant stirring. The FeBr$_2$ mixture is heated to 170° C. for ~2 hours and 30 minutes using a heating mantle; during this time, the sulfur precursor solution is prepared. For this precursor, 8.98 mmol of elemental sulfur (~288 mg) is dissolved in 15 mL of OLA. For complete dissolution of sulfur in OLA, ~10 minutes of ultra-sonication is performed. The sulfur solution is kept in hot water bath at ~90° C. Once the sulfur solution is ready, the temperature of the $FeBr_2$ solution is raised toward 220° C., and once it exceeds 216° C., the sulfur solution is rapidly injected. Nucleation of $FeS_2$ clusters initiates upon sulfur injection, and the growth of $FeS_2$ NCs proceeds at a temperature of 220° C.

Following two hours at 220° C., the NC solution is allowed to cool to room temperature, with continued stirring. Nanocrystals so obtained are washed, in one embodiment of the method they are washed a minimum of three times, using methanol as a non-solvent and toluene as solvent. In a first wash, methanol is added to the as-synthesized NC solution, followed by centrifugation for 10 minutes at 5000 rpm. After decanting the supernatant, the solvent is used to disperse the NCs with the assistance of sonication. Then, methanol is added to effect precipitation of the NCs, which allows for physical separation via centrifugation. In this embodiment, the washing procedure is repeated three times. Finally NCs so obtained are dried under nitrogen gas flow.

In another embodiment of the synthesis process, TOPO may be used as the surfactant and OLA as a non-coordinating solvent. In this method, $FeS_2$ NCs so obtained may be capped by TOPO. In an alternate embodiment, $FeS_2$ NCs can be synthesized using OLA without the presence of TOPO. In yet another alternate embodiment, high-quality $FeS_2$ NC can also be synthesized using 1,2-hexanediol as the surfactant and OLA as a non-coordinating solvent.

As described below, the inventors have developed embodiments of a method to fabricate $FeS_2$-based films suitable as back contact layers. Because of their large size (~70 nm-140 nm), $FeS_2$ NCs do not remain in stable suspension for long periods of time. A well-dispersed but unstirred solution will effectively change in concentration as the NCs settle to the bottom of the container. Thus, some impediments to conventional dip-coating methods and spin-coating have led to use of a drop-cast method for initial development. The inventors understand that these aforementioned impediments may be ameliorated using known production techniques to make NC films. For the sake of expediency, the inventors have utilized drop-cast films in a layer-by-layer (LbL) method. To fabricate the $FeS_2$ NC films, an $FeS_2$ NC solution was prepared in chloroform at a concentration of about 6 mg/ml. Film formation proceeded in an $N_2$ environment. In an embodiment of the method, a layer of drop-cast NCs is deposited onto the chosen substrate, and allowed to dry. At this point, the film can optionally be treated with hydrazine for ligand removal, as described below. In the case of an untreated film, the film thickness may be increased by simply repeating the drop-cast process followed by the drying process. The inventors have found that preparation of an approximately 1 μm film, in one embodiment of the method, typically relies on 2 drop-cast cycles.

To improve the conductivity of the NC films, in one embodiment of the method, long chain hydrocarbon molecules ($C_{24}H_{51}OP$, TOPO) were removed from the NC surface in LbL process by cyclically depositing and then treating films with 1 M hydrazine in ethanol. An embodiment defining preparation of an $FeS_2$ film treated with hydrazine to remove the surfactant is accomplished as follows. Subsequent to the first drop-cast layer deposition, the film is allowed to dry in the $N_2$ environment. The film is subsequently submerged in a 1 M hydrazine solution in ethanol for about 2 minutes. The film is withdrawn from the hydrazine solution and immediately submerged into a pure ethanol solution to remove any residual surfactant or hydrazine—i.e., as a rinse. The film is then allowed to dry. To attain a thicker film, the drop-cast/dry/hydrazine/rinse/dry process may be repeated as necessary for the desired film thickness.

$FeS_2$ NC films prepared by the LbL drop-casting method, above, may at times exhibit pin holes, i.e., microscopic areas of incomplete coverage by $FeS_2$, which have been found to occur independent of film thickness up to even 1 μm. The inventors have observed that, in some materials, an improvement in charge carrier mobility may be realized when neighboring NCs are brought into improved contact and/or surface defect states are removed. In an effort to ameliorate the presence of pinholes and to improve control over electronic properties, the NC films were sintered in the presence of sulfur vapor. The inventors believe that sintering may anneal the NCs together and/or promote grain growth resulting in a film exhibiting more uniform coverage and/or improved electronic properties.

In one embodiment, sintering of the films is conducted in a cylindrical quartz tube furnace such that the film is heated uniformly. In the quartz tube, two heaters are arranged: one is being used for evaporating the elemental sulfur at ~350° C. and the other is used to anneal the sample at various temperatures. Two ends of the quartz tube are sealed with flanges fitted with O-rings. Initially the tube is purged with a forming gas (95% argon, 5% hydrogen) for about 5-10 minutes and then low pressure argon gas (5 SCCM) is introduced during the sintering process. The sintering process proceeds with the substrate and film held at a temperature of about 500° C., within a sulfur vapor, for 1-3 hours. Alternatively, the temperature may be in a range of about 500° C. to about 600° C., and more particularly from about 500° C. to about 540° C. Sintering $FeS_2$ NC films relies on process monitoring due to a phase change from $FeS_2$ to FeS at high temperature. In other embodiments of the method and of the PV cells, FeS may also provide a suitable medium for Cu-free back contact formation. According to this particular embodiment of the method, a sulfur vapor is provided during sintering to protect pyrite $FeS_2$ from phase change at elevated temperature.

An embodiment of fabricating the semiconductor layers of a CdS/CdTe photovoltaic cell are describe. Cells described as sputtered and having CdS/CdTe layers were grown by RF magnetron sputtering. The cells consisted of a CdS film sputtered onto fluorine doped $SnO_2$ transparent conducting layer deposited on soda lime glass substrate, on top of which was deposited CdTe by the method of closed spaced sublimation (CSS). The inventors believe that magnetron sputtering techniques provide films with better adhesion, smaller grain size and relatively smooth surface due to its slow deposition rate at low temperature (200-300° C.). The inventors have also found that CSS has been a productive method due to the high deposition rate, low material consumption and low cost of operation. As compared with all-sputtered CdS/CdTe films, CSS of CdTe yields films with larger grain size (~1 μm vs. ~100 nm) due to the high deposition temperature (~600° C.). Independent of the deposition method, following the CdTe deposition a $CdCl_2$ treatment was carried out by dipping the CdTe layer in a solution of $CdCl_2$-methanol and subsequently annealing at 378° C. in dry air to advance grain growth, release interfacial strain, and facilitate sulfur and tellurium mixing at the CdS/CdTe interface. The thickness of CdS films in both methods was ~80 nm whereas the sputtered CdTe was ~2.0 μm and the CSS CdTe was ~4 μm. The inventors have found sputtered CdS/CdTe films enabling a typical conversion efficiency of ~12%, and CSS CdTe on sputtered CdS films enabling typical devices of ~14.0% efficiency. All device efficiency measurements were made under AM1.5G simulated solar spectrum at ambient laboratory temperature. For comparison purposes, standard devices were prepared on TEC15 TCO-coated glass (Pilkington N.A.) with a high-resistivity layer as part of the normal coating process. Following CdS/CdTe deposition, the standard back contact consists of a Cu/Au sequential deposition in which ~3 nm of Cu followed by ~30 nm of Au is evaporated onto the CdTe, and the film is then heated to 150° C. for about 45 minutes in air to drive Cu diffusion and improve the quality of the Au contact.

Figure 2A:
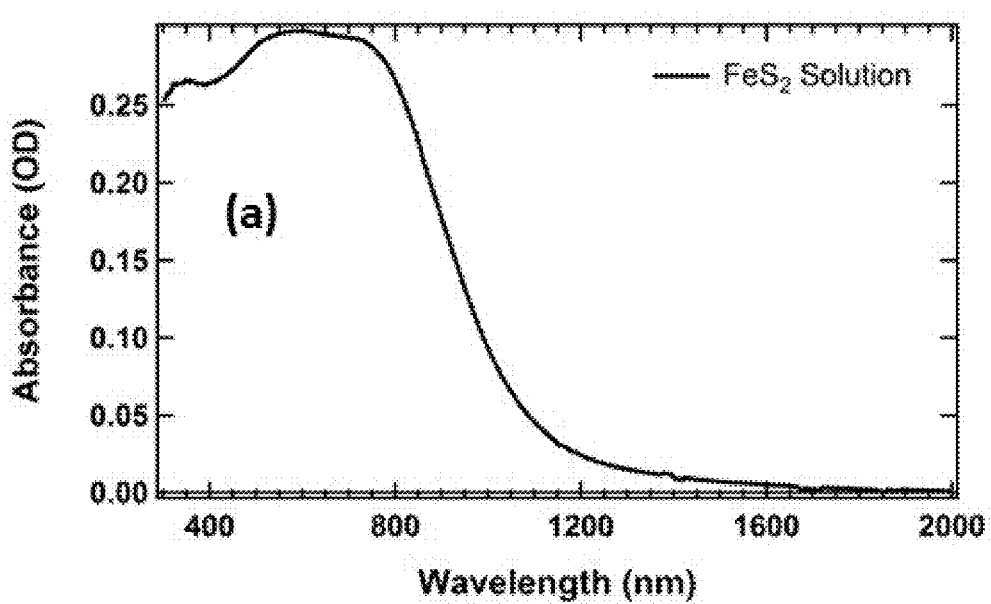
FIG. 2(a) is a graph of absorbance spectrum of as-obtained NC film dispersed in chloroform in accordance with the invention.
Figure 2B:
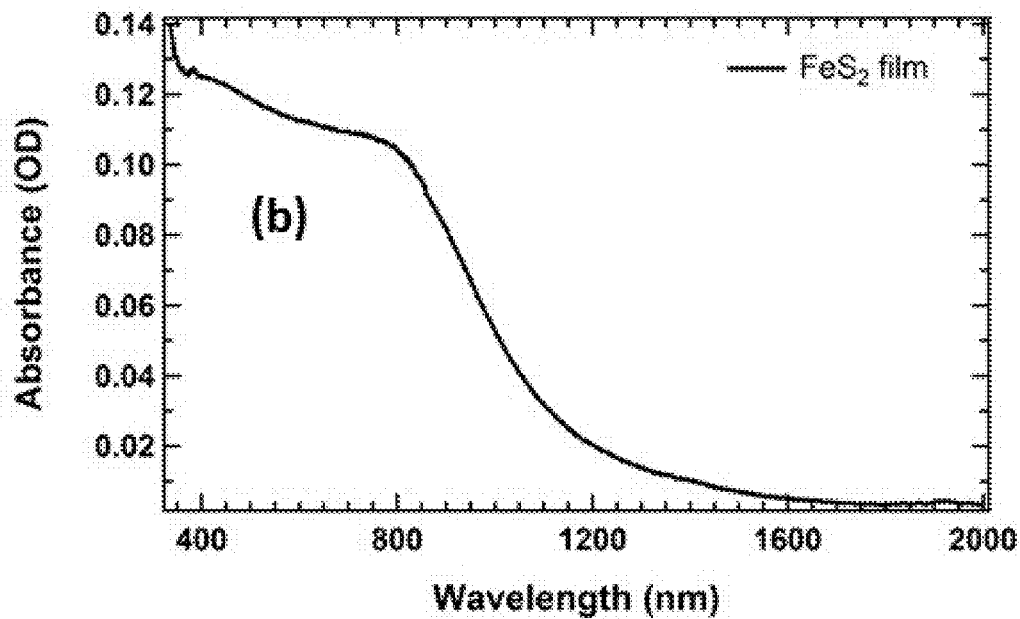
FIG. 2(b) is a graph of absorbance spectrum of NC film deposited on soda lime glass in accordance with the invention.
Figure 2C:
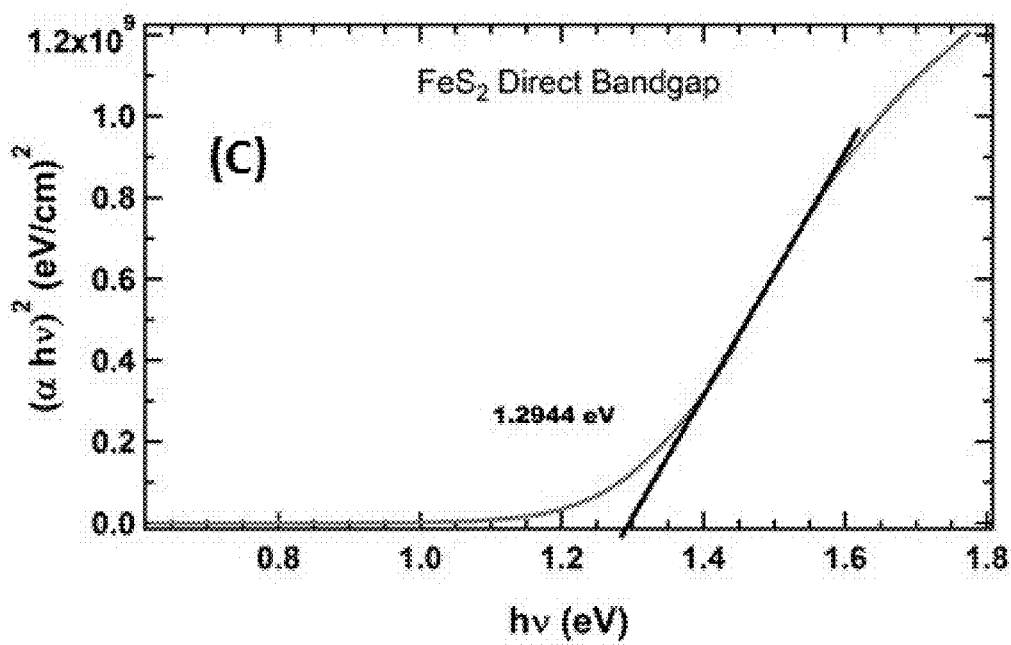
FIG. 2(c) is a graph of direct band gap determination for $FeS_2$ material in accordance with the invention.
Figure 2D:
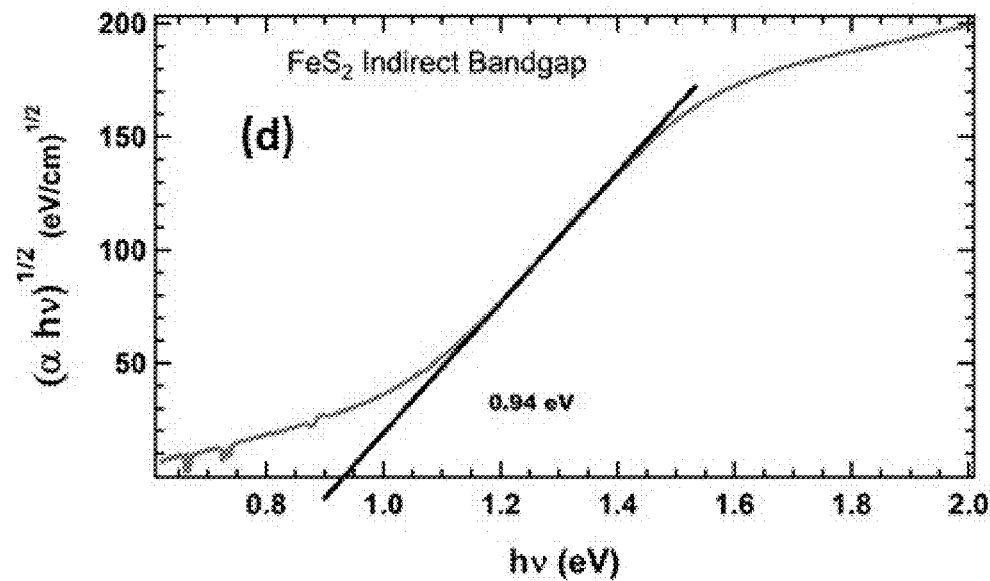
FIG. 2(d) is a graph of indirect band gap determination for $FeS_2$ material in accordance with the invention.

$FeS_2$ NC films were produced for evaluation of their structural and electrical characteristics. Absorbance spectrum of $FeS_2$ NCs dispersed in chloroform as well as absorbance spectrum of $FeS_2$ film deposited onto soda lime glass substrate are shown in FIGS. 2a and 2b. As shown in the graphs of FIGS. 2(a) and 2(b), most of the light absorption takes place throughout visible and near-infrared regions. In the region higher than 1200 nm, the film is more transmissive, though not completely. The absorption of light in the infrared region below the indirect band gap energy (0.95 eV, 1305 nm) has been ascribed to S vacancies in the $FeS_2$ film. It has been found that $FeS_2$ films, which show p-type defects and a high free carrier concentration, are prone to the formation of low-energy phases of Fe:S stoichiometry exceeding 0.5. Such phases include troilite (FeS) and pyrrhotite ($FeS_{1+x}$, x=0-⅐). Thus, the sub-bandgap infrared absorption may be ascribed to absorption caused by non-$FeS_2$ iron sulfide phases. FIGS. 2(c) and 2(d) show the measured results of direct and indirect band gaps of $FeS_2$ NCs in solution via optical absorbance spectroscopy. Based on the concentration of the NCs in solution together with the path length, an effective thickness of $FeS_2$ is used to convert optical absorbance to absorption coefficient ($\alpha$). Then, a graph of $(\alpha h\nu)^2$ vs. hν is used to extract the direct band gap of ~1.3 eV, and a graph of $(\alpha h)^{1/2}$ vs. hν is used to extract the indirect band gap of ~0.94 eV as shown in FIGS. 2c and 2d.

Figure 2E:
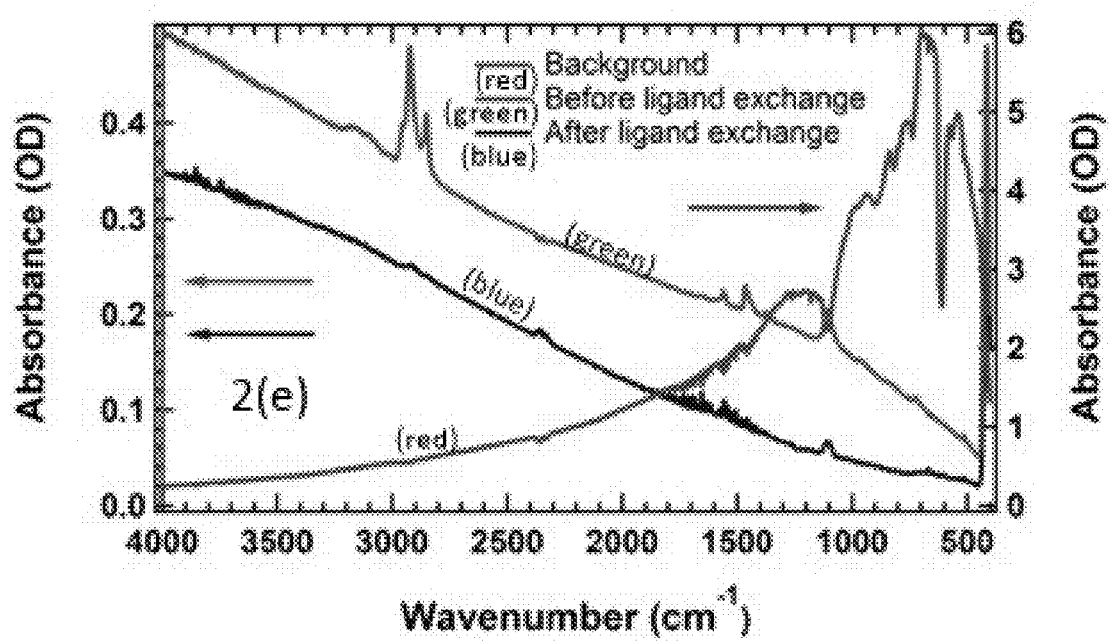
FIG. 2(e) is a graph of absorbance spectra of as-synthesized and hydrazine treated $FeS_2$ NC films taken from FTIR measurement.
Figure 2F:
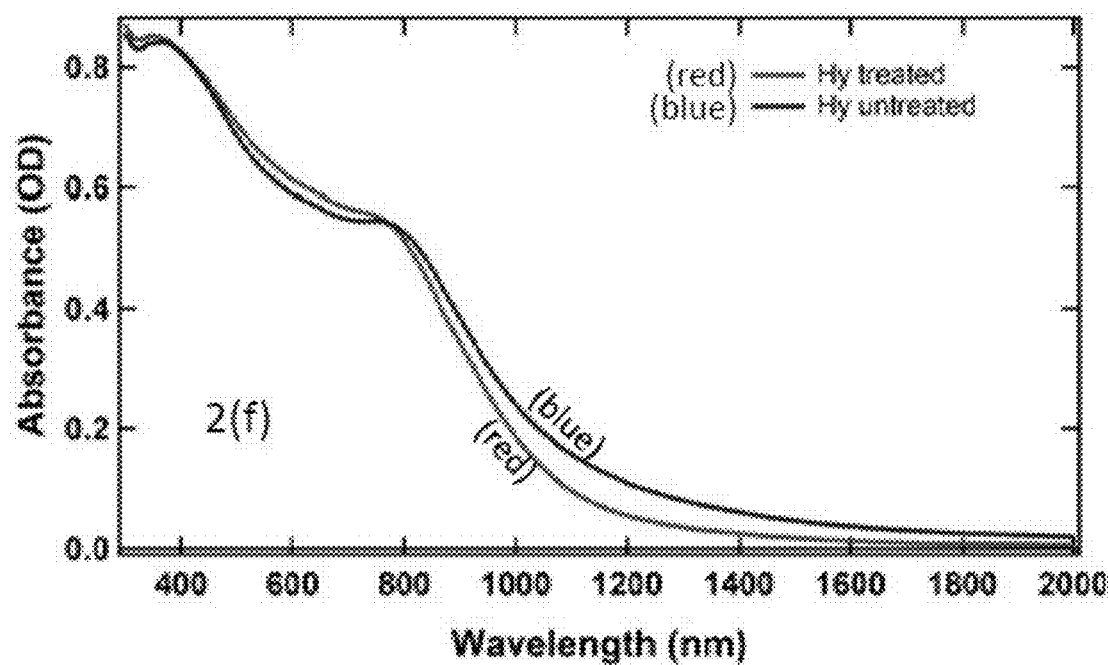
FIG. 2(f) is a graph of absorbance spectra of $FeS_2$ NC thin films, prepared on soda-lime glass substrate, before and after hydrazine treatment.

Iron pyrite NC films are prepared, as described above, using LbL drop-cast method. The films, used for structural and electrical characterization, are deposited on soda-lime glass or onto a zero-background single-crystal Si substrate. The films may be hydrazine-treated, untreated, and sintered or unsintered. Hydrazine treatment of the films is found to remove the capping ligands, serving to modify the electronic properties of the film. As shown in FIG. 2(e), in FTIR spectra, red is the reference background spectrum obtained from the bare Si substrate, while the green and blue lines respectively show signals for the $FeS_2$ NC film before and after ligand exchange. The C—H stretch signatures near 3000 $cm^{-1}$ and at 1500 $cm^{-1}$ show quantitative removal and/or replacement of TOPO (or 1,2 hexanediol) through hydrazine treatment.

Figure 3A:
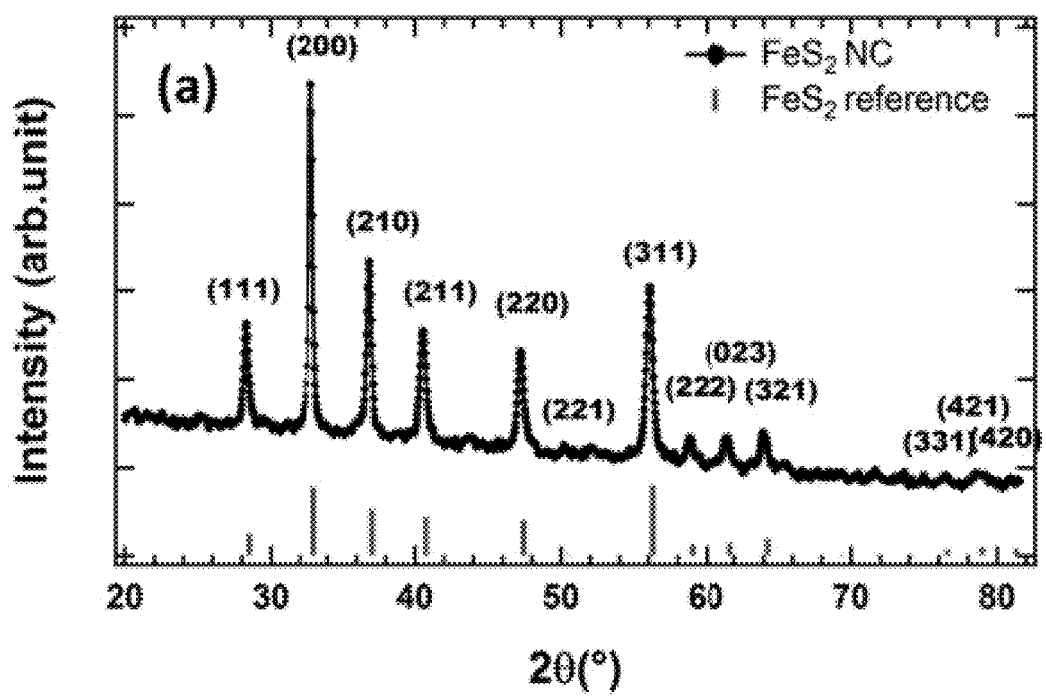
FIG. 3(a) is a graph of an XRD spectrum (focused beam) characterization of untreated and unsintered $FeS_2$ NC film deposited by drop-cast using NCs of size ~130 nm.
Figure 3B:
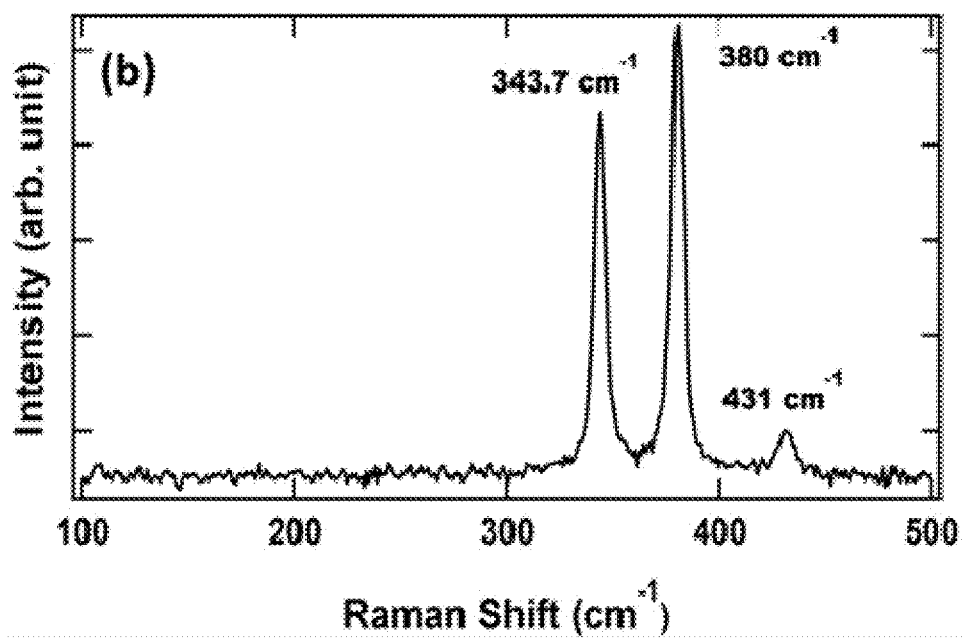
FIG. 3(b) is a graph of a Raman scattering spectrum characterization of an untreated and unsintered $FeS_2$ NC film deposited by drop-cast using NCs of size ~130 nm.
Figure 3C:
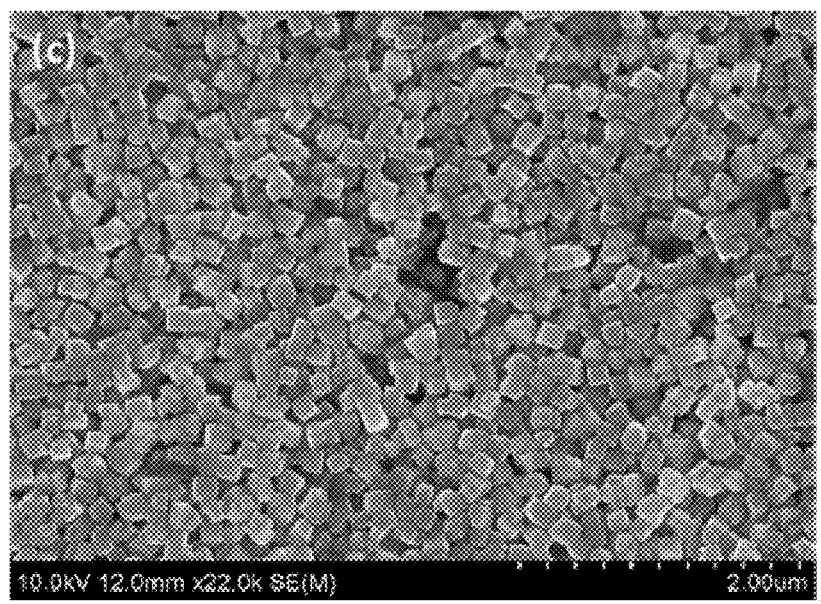
FIG. 3(c) is an SEM image (10 kV accelerating potential) of untreated and unsintered $FeS_2$ NC film deposited by drop-cast using NCs of size ~130 nm.
Figure 3D:
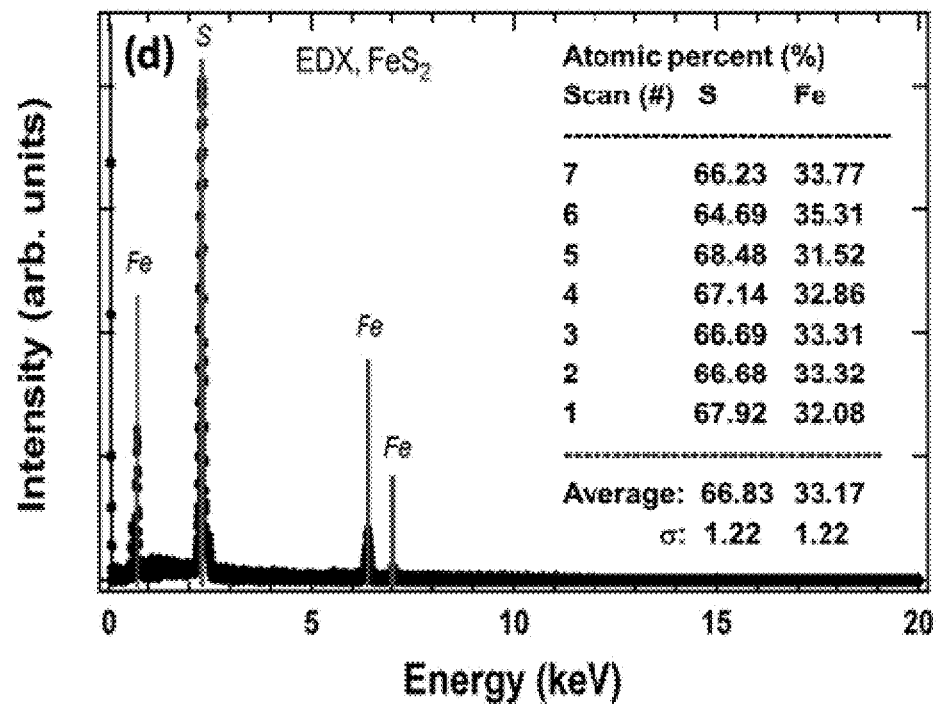
FIG. 3(d) a plot of EDX measurements of seven $FeS_2$ NC films fabricated from distinct NC syntheses.

FIGS. 3(a) to 3(c) show XRD, SEM and Raman spectra of as-deposited $FeS_2$ NC films. For XRD, the NC film was prepared on zero background Si substrate whereas for SEM and Raman they were prepared on soda lime glass substrate. As shown in FIG. 3(d), energy-dispersive X-ray spectroscopy (EDX) was used to determine the stoichiometry of $FeS_2$ NC films. The XRD image in FIG. 3(a) shows pure $FeS_2$ cubic phase with no evidence of other crystal structures. The sharp peaks in the XRD pattern indicate excellent crystallinity of the as-synthesized $FeS_2$ NCs. Three digit numbers in the bracket represent the Miller Indices for cubic crystal structures. XRD images for OLA capped and 1,2-hexanediol capped $FeS_2$ NCs are shown in FIGS. 4(a) to 4(d).

Figure 4A:
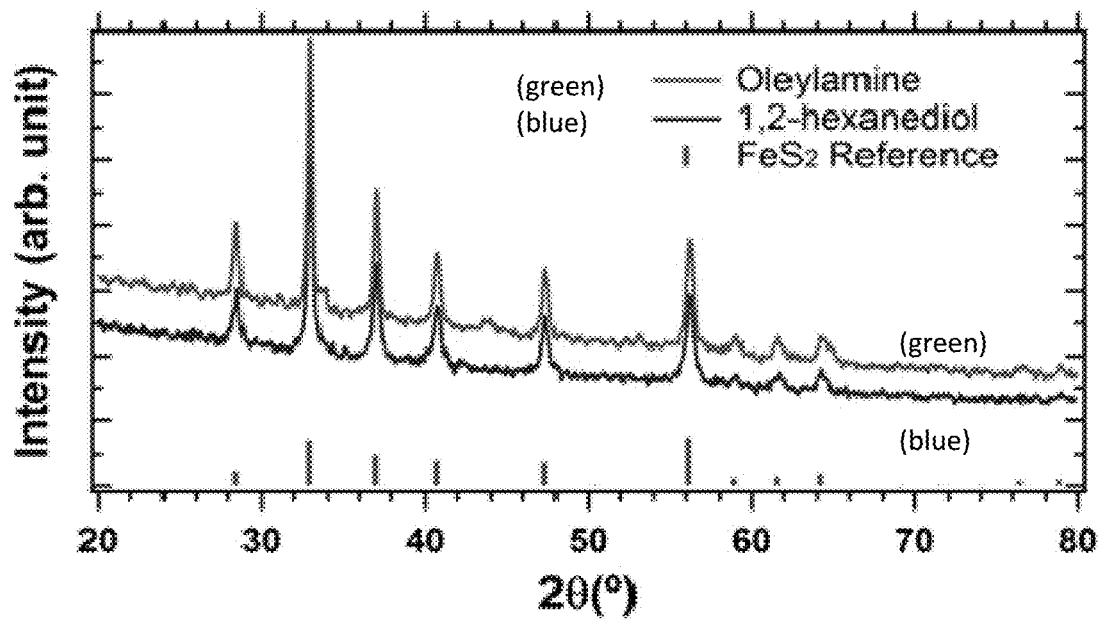
FIG. 4(a) is a graph of XRD pattern of oleylamine (OLA) and 1,2-hexanediol capped $FeS_2$ NCs.
Figure 4B:
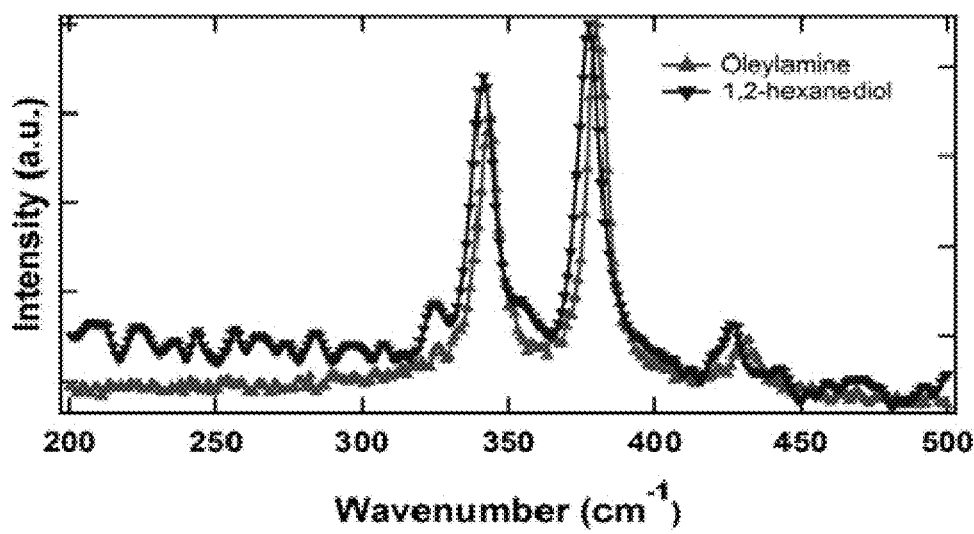
FIG. 4(b) is a graph of Raman spectra of phonon vibrations of $FeS_2$ for OLA capped and 1,2-hexanediol capped NCs.
Figure 4C:
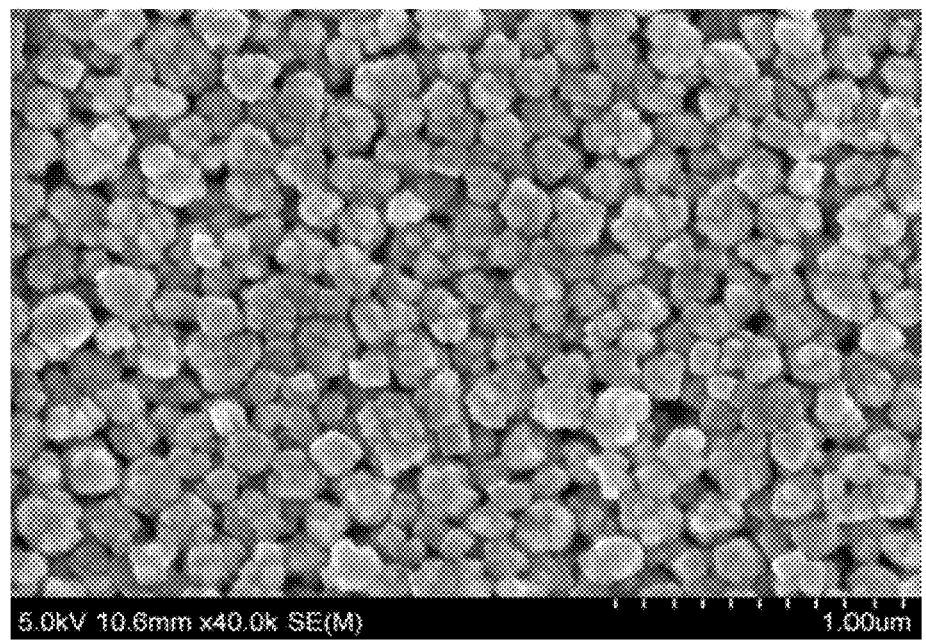
FIG. 4(c) is an SEM image for 1,2-hexanediol capped NCs.
Figures 4D, 5:
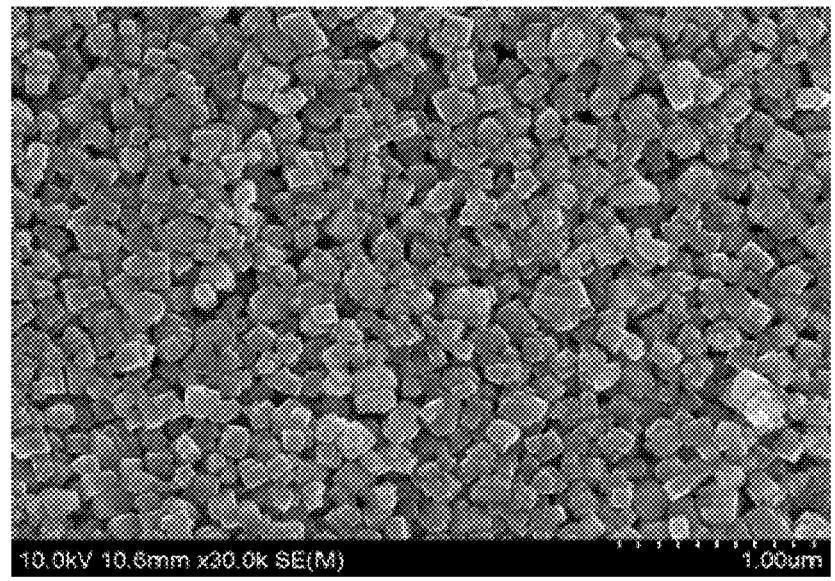
FIG. 4(d) is an SEM image for OLA capped $FeS_2$ NCs.
FIG. 5 is a table showing the effect of annealing temperature and time on the FWHM of the (200) XRD peaks measured for $FeS_2$ NC films.

Referring again to FIG. 3(b), the Raman spectra show peaks at 343.7 $cm^{-1}$, 380 $cm^{-1}$ and 431 $cm^{-1}$ which are consistent with phonon vibrations for $FeS_2$. These results rely on a value of $\lambda$=632.8 nm for excitation of $FeS_2$ film, due to a belief that that iron pyrite absorbs more strongly at 532 nm wavelength than at 633 nm. The Raman peaks we observe are well separated from Raman peaks reported for troilote (FeS) which shows peaks at ~210 $cm^{-1}$ and ~280 $cm^{-1}$ Raman spectra of OLA capped and 1,2-hexanediol capped $FeS_2$ NCs are shown in FIGS. 4(a) and 4(b). Uniform cubically-shaped $FeS_2$ NCs synthesized with TOPO/OLA combinations are shown in FIG. 3(c). Similarly, SEM images of $FeS_2$ NCs synthesized with 1,2-hexanediol/OLA combination and OLA alone are shown in FIGS. 4(c) and 4(d). The size of the NCs can be varied by varying the amount of surfactant. The average size of these large cubes is in a range of about 133±18 nm. Reducing the amount of TOPO resulted in $FeS_2$ NCs with average edge length <70 nm.

Photovoltaic cells previously produced using iron pyrite as one of the light-absorbing semiconductor layers exhibited reduced open circuit voltage (Voc) performance. The observed limitation of $V_{OC}$ performance was thought to be due to the possible significant sulfur deficiency. However, significant changes in the crystalline structure, and therefore the electronic properties of compound semiconductors, can arise from formation of phases that may correspond to relatively small deviations in stoichiometry. After these early photo-electrochemical solar cells, efficient solar cells using iron pyrite as a semiconductor layer have been elusive. Many of these prior $FeS_2$ semiconductor cells exhibited a significant decrease in S:Fe ratio in samples considered to be nominally iron pyrite. The S:Fe ratio was found to range from 2:1 to 1.74:1. Iron pyrite NCs used in the creation of $FeS_2$ NC back contact cells, as synthesized by the inventors, exhibit an essentially stoichiometric ratio, as shown in FIG. 3(d). Energy Dispersive X-ray Spectroscopy (EDX) measurement for seven different batches of $FeS_2$ NCs, synthesized with varying amounts of surfactant yielded an average S:Fe ratio of 2.01:1 representing iron pyrite as a stoichiometric compound. The inventors, however, note that even small amounts of phase impurities, especially those near the 2:1 S:Fe ratio, may noticeably alter the aggregate sample optical and electronic properties. As shown in FIG. 3(a), considering the intense peak at (200), the full-width-at-half-maxima (FWHM) and grain size were calculated for all XRD spectra taken at different temperatures. The table of FIG. 4 shows that with increased temperature and annealing time, the (200) peak FWHM decreases, which also corresponds to an increase in the average grain size.

In order to confirm the limitations in performance of cells using $FeS_2$ films as semiconductor layers, $FeS_2$ films that were (1) as-synthesized, (2) hydrazine treated, and (3) hydrazine treated and annealed, for the fabrication of Schottky junction and heterojunction solar cells employing $FeS_2$ as the absorber layer. In all cases, results showed no improvement in PV performance resulting from hydrazine or thermal annealing treatments. Performance of the devices was slightly better when ITO was used as a front contact instead of HRT/TEC15. However, in all cases the PV devices yielded effectively zero open circuit photovoltage and zero short-circuit current density (the J-V curve passed through the origin).

Electrical properties of $FeS_2$ NC films were studied using hot probe measurement, four point probe measurement, and Hall measurement methods, with results summarized in the tables of FIGS. 7 and 8. All hot probe measurements indicated that the $FeS_2$ films used as semiconductor layers were p-type, in agreement with comparative data for other polycrystalline and NC-based films. This indicated that the majority of charge carriers in these pyrite films were holes. The table of FIG. 7 shows the sheet resistance for two pairs of two different $FeS_2$ NCs on soda-lime glass, each in three or four different conditions, depending on the surfactant/solvent type. For the first sample type, $FeS_2$ NCs were synthesized using 1,2-hexanediol/OLA. For the second case, $FeS_2$ NCs were synthesized using TOPO/OLA. In the first case, three different films were prepared: the first as-synthesized NC film (condition: No, No), the second NC film treated with hydrazine but at room temperature (condition: Yes, No) and the third NC film treated with hydrazine and annealed in sulfur vapor for an hour at about 500° C. (condition: Yes, Yes). In the second case, the additional condition of an as-synthesized NC film annealed in sulfur vapor (No, Yes) was tested. The sheet resistance of the films decreases by a factor of about 10 for films in the as-synthesized condition treated with hydrazine. Sheet resistance also decreased by another factor of 10 for films hydrazine-treated and annealed versus only treated with hydrazine. Resistivity of the films in each case is obtained by multiplying sheet resistance by the average thickness of the films. These sheet resistances are very close to ones obtained from Hall measurement as given in the table of FIG. 8. The decrease in sheet resistance of the hydrazine treated films correlates with the removal of the organic molecules from the surface of the NCs which insulate neighboring NCs against electrical conduction. When the films are annealed at high temperature, any leftover organic molecules are evaporated, and also the grain size of the NCs increases slightly which reduces the density of grain boundaries within the film.

Free carrier concentrations of the $FeS_2$ NC films increased by a factor of about 2 following hydrazine treatments and by another factor of about 2 to about 5 following sulfur vapor thermal annealing. The maximum carrier concentration of treated and annealed film was on the order of $10^{19}$ $cm^{-3}$ or higher in some cases. Surprisingly, the inventors have found that these $FeS_2$ NCs, even in their apparent pure phase, possess very high carrier concentrations. Also surprising is that when the films are annealed at high temperature (>500° C.), carrier concentrations are found to increase. As obtained by Hall measurement, in all different conditions, the mobility of the carriers in the NC film is found to be <<1 $cm^2$ $V^{-1}$ $s^{-1}$. Conductivity is proportional to the product of carrier concentration and mobility. Very low mobility within an absorber layer strongly affects the workings of solar cells because poor transport under an electric field (drift) may lead to substantial charge at interfaces under solar illumination. In addition, high carrier concentration leads to very short depletion widths, and one would have to rely on relatively long diffusion lengths.

The built-in electric field in the depletion region of a heterojunction solar cell serves to separate the photogenerated charge carriers across the interface. If the carrier concentration on p-region is significantly higher than for the n-region, width of window layer is depleted by the majority charge carriers of p-type region. However, the built-in electric field in n-type material does not contribute to the collection of photogenerated charge carriers as most of the incident photons pass through this region because of its wide band gap. In our efforts to create $FeS_2$ absorber layer solar cells, the window layer transmitted most of the solar spectrum, and those photons absorbed within the n-type window layer did not generate meaningful photocurrent. In addition, the photogenerated e-h pairs within the $FeS_2$ primarily recombine prior to diffusing to the (small) depletion region where they could be separated.

Figures 9, 10A:
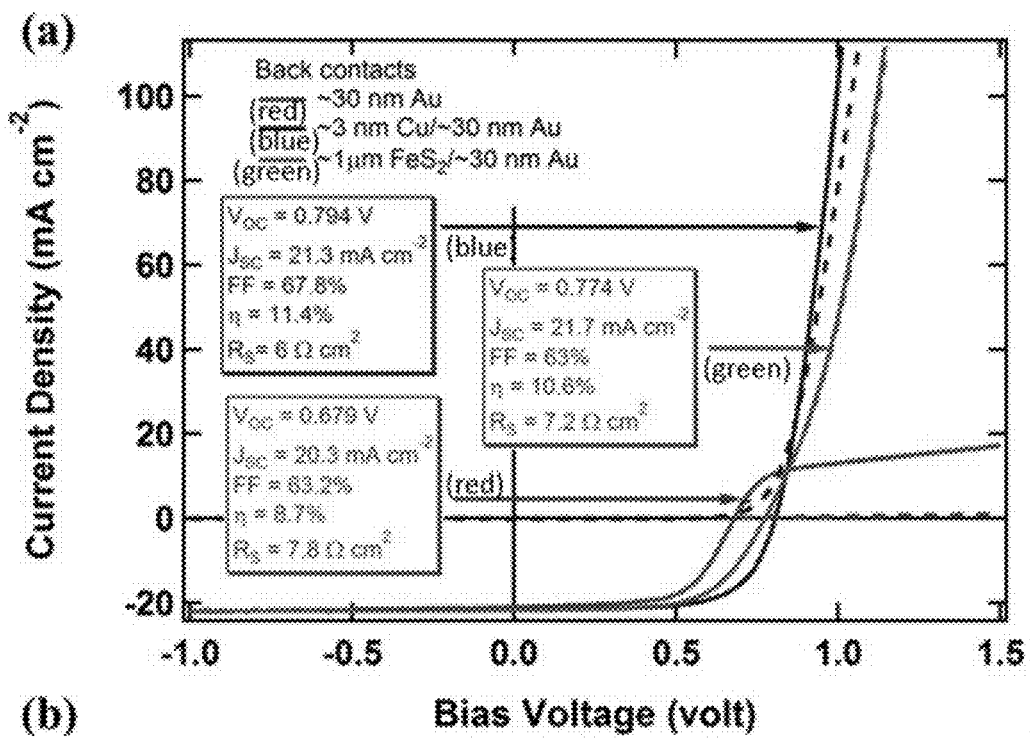
FIG. 9 is a table showing average parameters for 15 CdTe solar cells before and after heating.
FIG. 10(a) is a plot of current density vs. bias voltage measurements of sputtered CdS/CdTe devices having Au, Cu/Au, and $FeS_2$/Au back contacts evaluated under simulated AM1.5G solar spectrum conditions.

As mentioned above, $FeS_2$ NC films have made a high-performance back contact to CdTe solar cells without the use of Cu. Representative current density/voltage (J-V) characteristics for sputtered CdTe devices prepared with different back contacts are shown in FIG. 10(a), and average device parameters are presented in the table of FIG. 9. These solar cells were prepared on 1"×1" substrates and mechanically scribed to produce smaller cell areas of approximately 0.085 $cm^2$.

The table of FIG. 9 demonstrates average and standard deviations of 15 cells of one kind prepared on a substrate. Each J-V curve in FIG. 10(a) shows representatives of these 15 cells. The solid lines represent light response and broken lines represent dark response of the devices. The red line represents the J-V curve when 30 nm Au was evaporated as a back contact, without any Cu diffusion layer, showing a short circuit current density of 20.3 mA $cm^{-2}$. Although the Jsc does not drop significantly compared to the other back contact types, Voc and efficiency ($\eta$) are poor when Au is used as a back contact. Because of the high electron affinity of CdTe, −4.5 eV, a high work function material is desirable to form a zero barrier height (ohmic) contact with p-type CdTe. With available metals used in typical back contact layers, a Schottky barrier is formed with CdTe at its typical free hole concentration. The resulting barrier causes a significant limitation to hole transport from the CdTe to metal. The Schottky junction acts as a diode, the direction of which opposes the main diode formed between CdS/CdTe interfaces. The diode at the back contact causes the current-voltage curve to roll-over at a forward bias, decreasing both the fill factor as well as the open-circuit voltage.

The above-mentioned limitations associated with using a metal-only (e.g. Au) back contact are minimized by depositing about 3 nm Cu and about 30 nm of Au onto CdTe and annealing the film at 150° C. for about 45 minutes. The interdiffused Cu can form a distinct $Cu_{2-x}Te$ layer and increase the effective doping level of a thin layer of the CdTe through inter-diffusion. The $Cu_{2-x}Te$ layer increases the conductivity and reduces the barriers, thus allowing ohmic behavior at this interface. Referring now to FIG. 10(a), when a 3 nm thick layer of Cu was deposited before Au (blue curve), the Voc improved from 0.679 V to 0.794 V and efficiency improved from 8.7% to 11.4%. When 3 nm Cu was replaced by a 1.5 µm thick $FeS_2$ NC layer at room temperature and 30 nm thick Au atop of it (green curve), performance of the device was similar to the Cu/Au standard back contact. The $FeS_2$ NC back contact, which consisted of an unheated hydrazine-treated film, showed a Voc=0.774 V, $J_{SC}$=21.7 mA-$cm^{-2}$, and a 10.6% efficiency. The fill factor did decrease due to a residual barrier, and there was a slight increase in the apparent series resistance at the back contact. The inventors have observed an increase in the Jsc several times. While not wishing to be bound by theory, the inventors believe that sources of the increased Jsc are one or more of (a) Reabsorption of transmitted light by back-reflection, (b) a reduced interfacial recombination velocity at the back contact, and (c) a systematic error in the device area. The inventors believe that source (c) has been preliminarily addressed by QE measurements, which do not depend on the device area. As discussed below, the QE measurements shown in FIG. 10(b) show that the FeS$_2$ back contact improves carrier collection in the CdTe and reduces the collection efficiency for photons absorbed in the CdS.

Figures 13A, 13B, 13C:
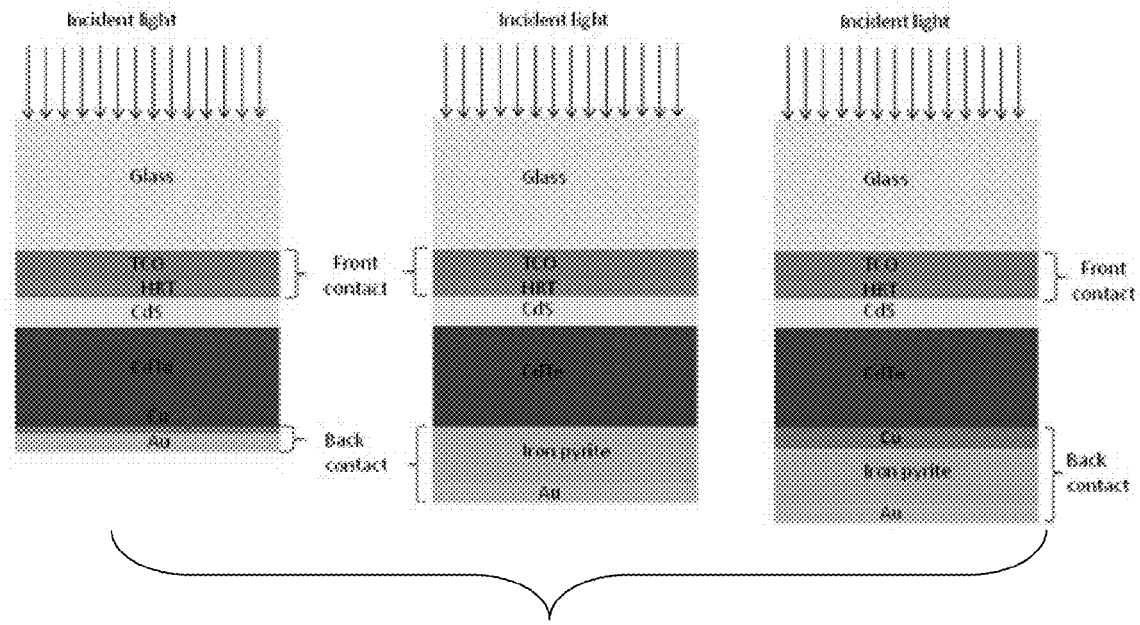
FIG. 13a is a schematic representation of a conventional CdS/CdTe solar cell having a Cu/Au back contact.
FIG. 13b is a schematic representation of an embodiment of a CdS/CdTe solar cell having an iron pyrite/metal (FeS$_2$-NC/Au) back contact in accordance with an embodiment of the invention.
FIG. 13c is a schematic representation of an alternative embodiment of a CdS/CdTe solar cell having a metal/iron pyrite/metal (eg. Cu/FeS$_2$-NC/Au) back contact in accordance with another embodiment of the invention.
Figure 14:
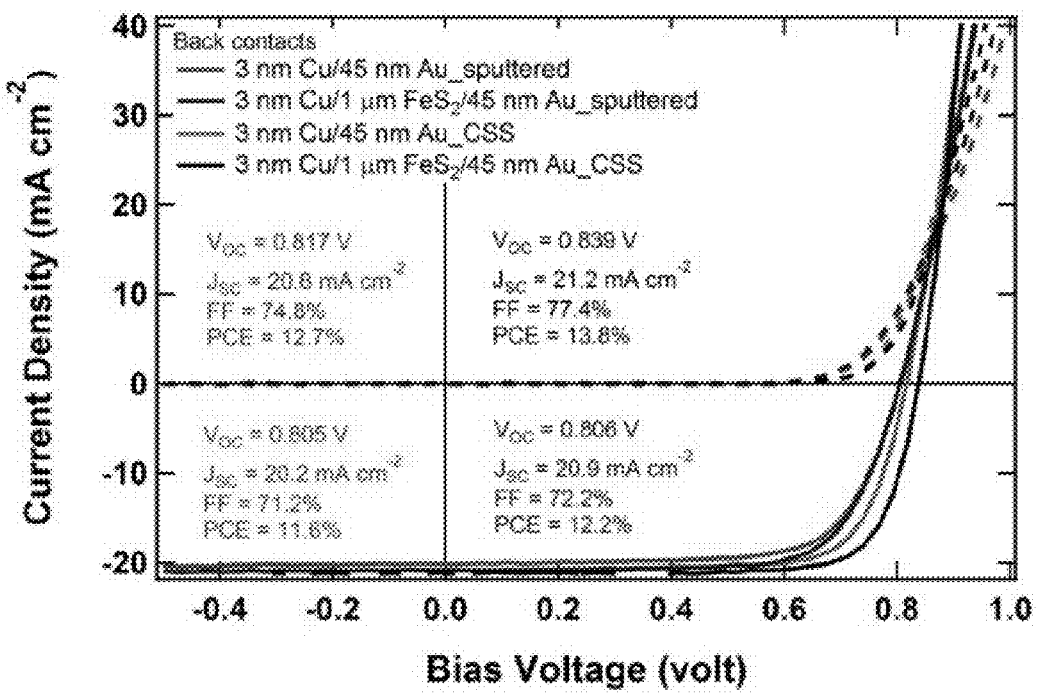
FIG. 14 is a plot of current density-voltage (J-V) characteristics of CdS/CdTe solar cells using Cu in conjunction with a FeS$_2$/Au back contact compared with standard back contact (Cu/Au).
Figures 15, 16:
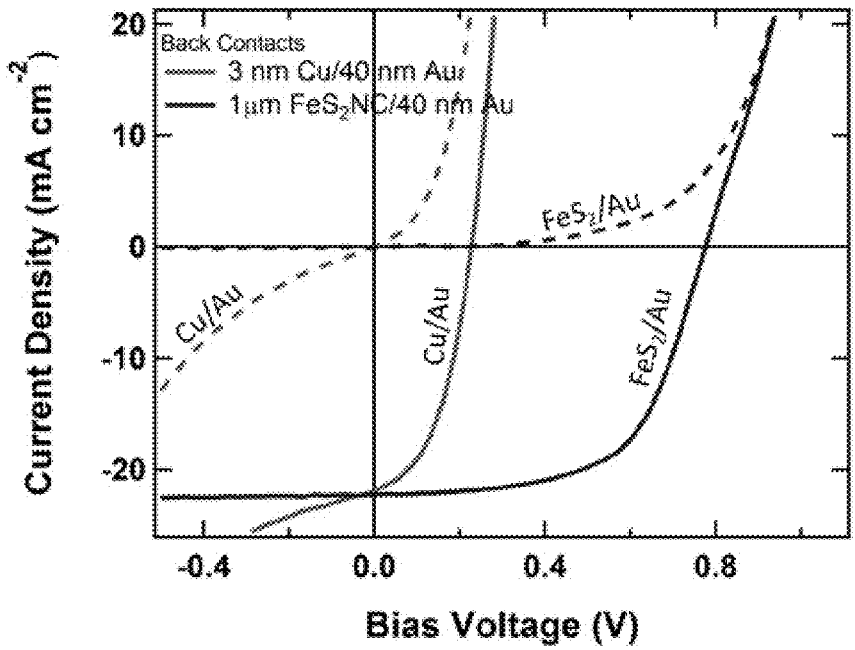
FIG. 15 is a comparative plot of current density-voltage (J-V) characteristics of CdS/CdTe solar cells using an FeS$_2$/Au back contact and a standard back contact (Cu/Au).
FIG. 16 is a comparative table of CdTe solar cell performance having different back contact configurations.

The structure of solar cells formed having a conventional metal/metal (Cu/Au) back contact, an iron pyrite/metal (FeS$_2$-NC/Au) back contact, and a metal/iron pyrite/metal (Cu/FeS$_2$-NC/Au) are shown in FIGS. 13(a), 13(b), and 13(c). While the inventors have produced CdTe solar cells exhibiting high-performance back contacts utilizing FeS$_2$ NC films made without Cu, to mitigate semiconductor layer shunting issues, Cu can provide benefits to cell performance. The thin layer of Cu utilized in the standard Cu/Au back contact improves performance by increasing the CdTe free hole concentration, one effect of which is a narrowing of the residual back barrier and improved hole tunneling efficiency. The inventors have realized an added benefit to performance by the inclusion of a metal, such as Cu, between the FeS$_2$-NC/Au layer and the adjacent CdTe semiconductor layer. The demonstrated beneficial effects of a Cu/FeS$_2$-NC/ Au back contact configuration are shown in FIG. 14. Devices were fabricated where three-layer back contacts were deposited as 3 nm Cu/1 pm FeS$_2$/45 nm Au. The devices were formed as both sputtered and CSS CdTe devices. As shown in FIG. 14, the presence of the FeS$_2$ NC layer improved the performance of the devices compared with that of the standard Cu/Au back contact devices. While not completely making the barrier ohmic, when the FeS$_2$-NC layer is deposited onto Cu and the back contact is completed with Au, the performance of the device increases. While not wishing to be bound by theory, the inventors believe that copper narrows the barrier width, and FeS$_2$ reduces the series resistance and increases $V_{OC}$. This may be an effect of the FeS$_2$ NC layer serving as a buffer layer with a relatively high work function. The device efficiency improves by ~5-9% when incorporating an FeS$_2$ NC layer between the Cu-treated CdTe and the Au external contact layer.

Contrary to Cu/Au back contacts, when Au was deposited after FeS$_2$ layer, the device was not heated. A very thick layer of >1.5 µm of FeS$_2$ NCs was deposited onto the CdTe layer to prevent the final Au layer from reaching the CdTe layer through FeS$_2$ layer pin holes. While a thick layer of FeS$_2$ NCs may decrease fill factor of the solar cells because of a series resistance increase at the back contact, the FeS$_2$/Au samples compared favorably over conventional Au and Cu/Au back contacts. To test the stability of the back contacts (Au, Cu/Au and FeS$_2$-NC/Au), the completed devices were tested at room temperature, and then again after heating to 100° C. in an N$_2$ environment for several hours. The table of FIG. 9 shows performance data for all three devices before and after the heat treatment. Any decreases in Voc and Jsc is comparatively less when FeS$_2$/ Au combination was used as a back contact. After a 23 hour period, cell efficiency of those having FeS$_2$/Au back contacts is similar to the Cu/Au cells. The inventors have found better performance when these devices are heated to about 200° C. for a short period of time.

Figure 10B:
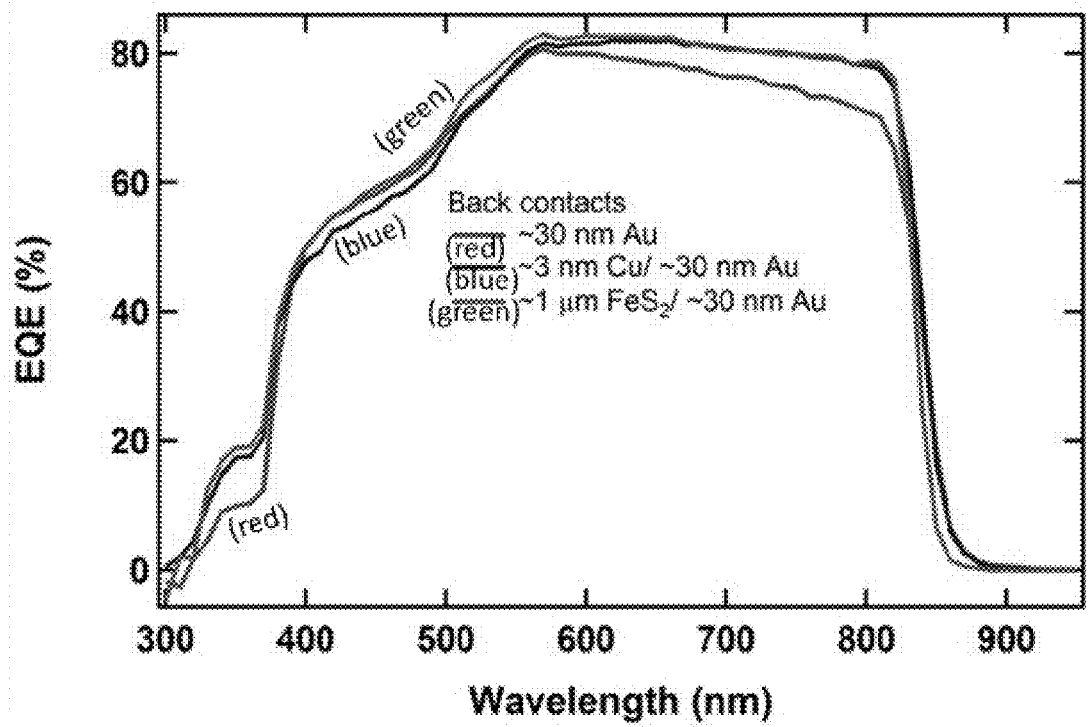
FIG. 10(b) is a plot of external quantum efficiency for sputtered CdS/CdTe devices with Au, Cu/Au and $FeS_2$/Au back contacts.

Carrier collection efficiency of the devices used for FIG. 10(a) were examined by comparing their external quantum efficiency (EQE) measurements of devices with Au, Cu/Au and FeS$_2$/Au back contacts and given in FIG. 10(b). In the wavelength region from 500 nm to 850 nm, carrier collection when Au was used as a back contact was less than when the back contacts were Cu/Au and FeS$_2$/Au based. While not wishing to be bound by theory, the inventors believe that the observed deep penetration loss seen at wavelengths higher than 700 nm is caused by insufficient thickness of CdTe layer. In other words, the penetration depth of light at this wavelength region is higher than the thickness of the CdTe film. Higher carrier collection in long wavelength region, when FeS$_2$ NC was used as a back contact, suggests a slower recombination velocity of minority charge carrier generated near the back contact. The EQE in the region from 375 nm to 500 nm depends on the CdS thickness and there is a slight variation of CdS thickness in each sample. In the case of FeS$_2$/Au back contacts, an increase in band gap of the CdTe by about 10 nm can be observed.

Figure 11A:
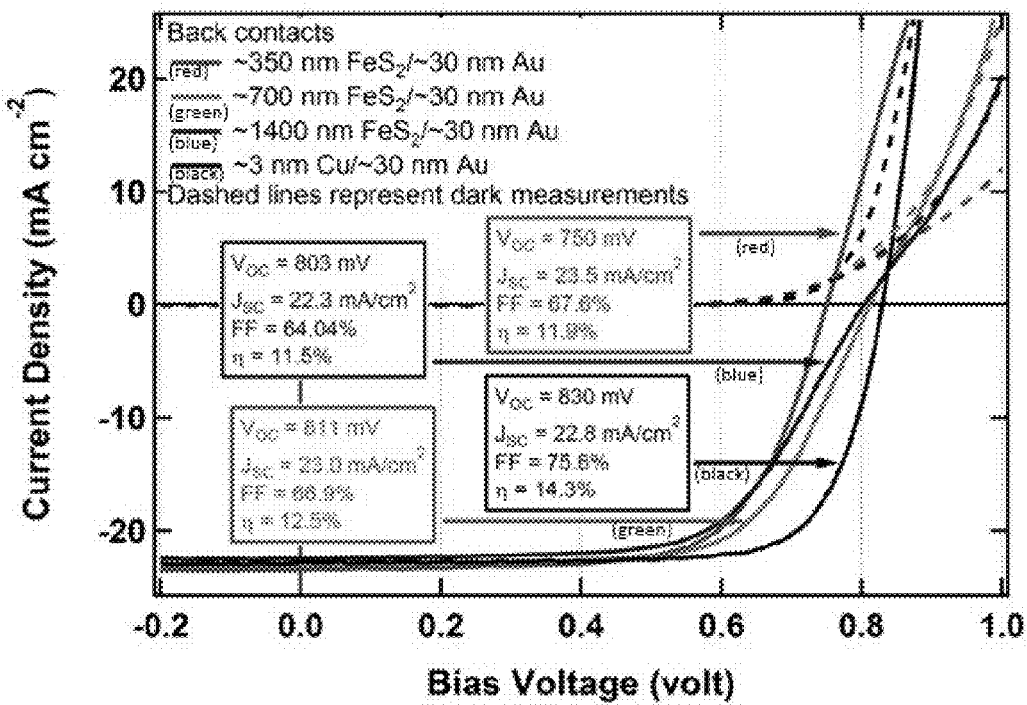
FIG. 11(a) is a plot of J-V curves for CSS CdTe devices where the $FeS_2$ thickness varies from 0.35 μm to 1.4 μm; comparison is made with standard device.
Figure 11B:
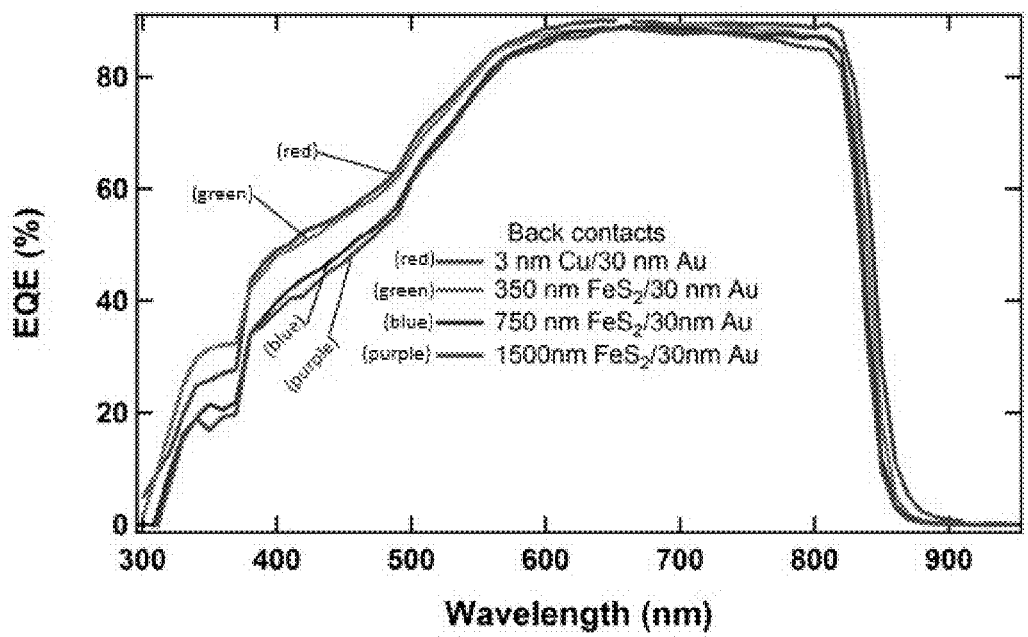
FIG. 11(b) is a plot of EQE of CSS CdTe solar cells in three different $FeS_2$ thicknesses along with EQE of standard device

The dependence of device performance on the FeS$_2$ NC thickness as a back contact is illustrated in the graphs of FIGS. 11(a) and 11(b). For comparison purposes, a CdTe device having an efficiency of about 14.5%, under STC, with Cu/Au as the back contact was used as a baseline (black curve). The Cu/Au back contact was replaced with varying thicknesses of FeS$_2$ NC layers (from 0.35 µm to 1.5 µm), fixing the other device architecture and processing parameters. An about 30 nm Au layer was deposited following fabrication of the hydrazine-treated FeS$_2$ NC film. The current-density voltage curves in all four different cases are shown in FIG. 11(a) and corresponding QE curves are shown in FIG. 11(b). The inventors found that the thin FeS$_2$ layers (0.35 µm) tended to yield lower performance, perhaps due to an increased occurrence of pinholes which may allow Au to contact the CdTe directly, thus, lowering the Voc. The thickest FeS$_2$ film (1.4 µm) showed an effectively increased series resistance and thus a decreased Voc. Comparatively low photo-conversion efficiency of the device, when the back contact was 0.35 µm of FeS$_2$ and 30 nm of Au, is due to the reduced Voc even though other parameters are considerably higher. When the FeS$_2$ thickness was at the maximum, both Jsc and fill factor were lower ultimately decreasing the efficiency of the solar cells. Optimized performance of the solar cell was found when FeS$_2$ thickness was ~0.7 µm in which Voc, Jsc, FF and η are only 2.9%, 0.4%, 10% and 13% less than standard device.

Figure 12:
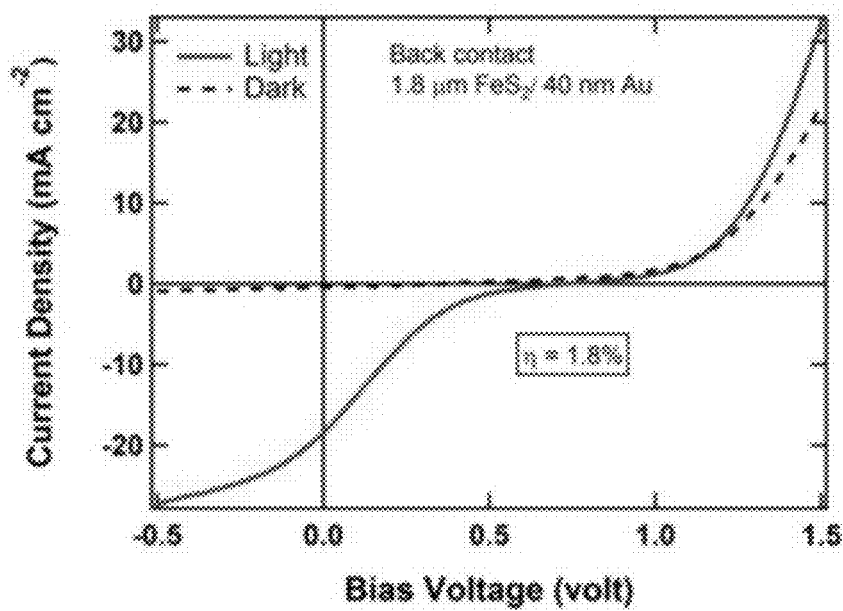
FIG. 12 is a plot of J-V curves for a sputtered CdTe photovoltaic cells having a back contact of untreated $FeS_2$ NC film.

The inventors have found that the electrical properties of the FeS$_2$ NC layer are significantly different from those of bulk metal or semiconductor layers. During the synthesis of the FeS$_2$ NCs, a long chain C—H molecule (TOPO) has been used. Trioctylphosphine oxide controls the growth rate, determines the size of the NCs, and caps the NC surface. The length of these TOPO molecules is about 1.1 nm with the outer part of the molecule being hydrophobic. An estimate of the typical separation between two neighboring NCs in the as-deposited film is about 2.2 nm. This separation creates an insulating film and inhibits charge transport through the contact. However, when the FeS$_2$ films are treated with hydrazine, these long molecules are removed, and the NC surfaces are capped by hydrogen atoms. Since hydrazine tends to remove oxygen from the reaction medium, reaction with an oxygen containing compound leaves hydrogen in the place of oxygen. The hydrazine reacts with TOPO to remove the oxygen, and as such, the association of TOPO with the iron pyrite NCs ceases because this association takes place through oxygen atoms on TOPO. As a result, the TOPO is removed. In addition, the inventors believe that hydrazine may remove a substantial amount (or even all) of the dissolved oxygen from the suspension where FeS$_2$ NCs are present, thus improving the resistance of the film to further oxidation. As an aspect of the method of the invention, in certain embodiments it may be advantageous to vary the hydrazine treatment time depending on the concentration of the NC solution and the resulting single-cycle layer thickness. FIG. 12 illustrates the effects on cell current-voltage curves in the case where TOPO remains in the FeS$_2$ NC film.

The untreated film shows a clear S-shape signature, indicative of a transport barrier formed at the back contact. The "S" or "kink" shape has been previously observed under illumination in CIS and also organic solar cells when a charge buildup occurs at one contact. The inflection points in the J-V curves, also called S-kinks, are mostly seen in organic solar cells which are attributed to charge transport layers energetically misaligned to the energy levels of the active materials in planer heterojunction solar cells. For the $FeS_2$-NC back contact cells, a charging is likely occurring, associated with reduced transport through the $FeS_2$ contacting layer, resulting in the S shape J-V curves.

In FIG. 12, the J-V curve is obtained from sputtered CdTe solar cells. Thickness of the $FeS_2$ NC and Au are shown in FIG. 12. Carrier concentrations of $FeS_2$ NC films are about $10^{19}$ cm$^{-3}$, lower than the carrier concentrations of metals. In certain embodiment, the $FeS_2$, used in conjunction with another metal, such as Au, eliminates the reliance on Cu and provides for long term stability of the CdTe devices. Thus, in certain embodiments, a thin layer of Au applied on the $FeS_2$ layer facilitates good electrical contact. In FIG. 12, Voc and Jsc remain relatively high but the efficiency drops significantly due to reduced fill factor. The inventors believe that the low fill factor may result from the S-shape J-V curve, which shows $d^2J/dV^2<0$ for much of the power-generating quadrant.

For the $FeS_2$-NC material, this S-shaped behavior is seen at or near the open circuit voltage region. Under open circuit conditions, the total current at every location inside the solar cell is generally zero. For this condition to transpire, the internal current densities for electrons and holes are equal and of opposite sign. In solar cells, an infinite minority surface recombination always creates a steady diffusive recombination current towards the back contact. This current is neutralized by an equivalent majority surface recombination current. Because of the long chain hydrocarbon molecules in an untreated $FeS_2$ NC film, transport of light induced charge carriers is reduced thus reducing the surface recombination velocity. To satisfy a zero net-current condition, the majority charges will be accumulated at the surface. This situation creates a space charge region creating an electric field at the interface and thus generating S-shaped J-V curves around Voc. This situation lowers fill factor, and possibly Voc to some extent, which may decrease the efficiency of the solar cells. This double diode behavior has been appeared in J-V curves when the TOPO molecules are not removed or only partially removed from the NC surface.

The $FeS_2$ NC films used in the invention have shown p-type conductivity, as determined by hot probe measurement. When $FeS_2$ films exhibit p-type conductivity, the valence and conduction band positions are approximately −4.3 eV and −5.6 eV from the vacuum level, respectively. Since the electron affinity of the $FeS_2$-NCs (p-type) is about −4.3 eV and considering a direct band gap of 1.3 eV, the valence band edge is about −5.6 eV from the vacuum level. This is close to the valence band edge of CdTe, thus providing a close match to the CdTe layer. Since $FeS_2$ is highly conductive, the position of the Fermi level is very close to the valence band edge, which is higher than the work function of CdTe. In such a case, $FeS_2$ can form a zero barrier height contact with CdTe.

Figure 6A:
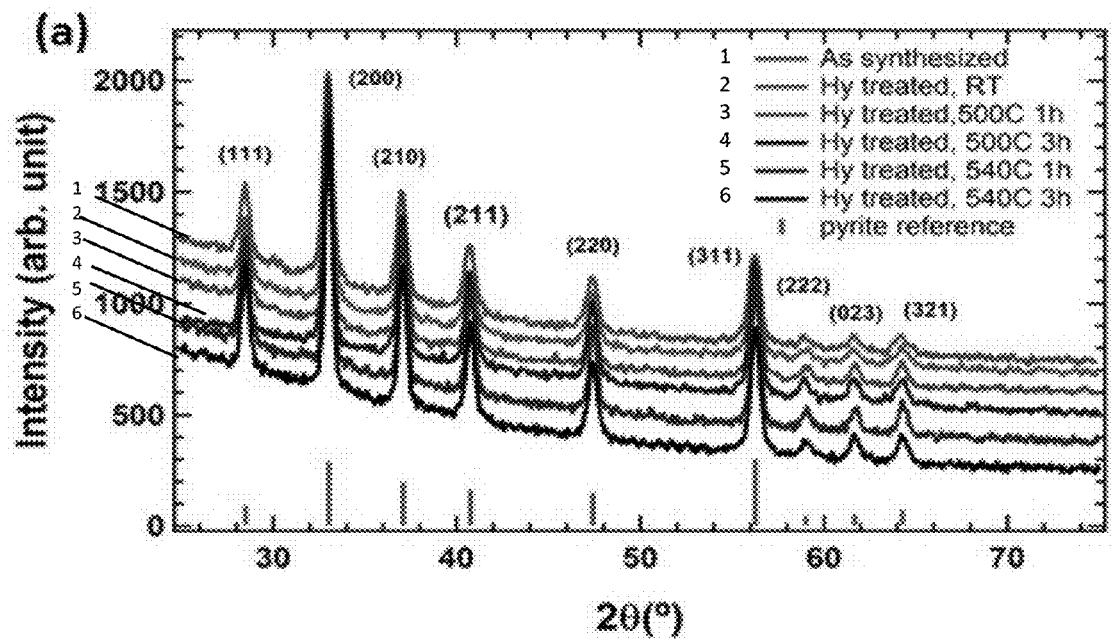
FIG. 6(a) is a plot of an XRD spectral characterization of $FeS_2$ NC films deposited by LbL drop-cast method using NCs of size ~70 nm showing the effect of hydrazine and thermal annealing treatment.
Figure 6B:
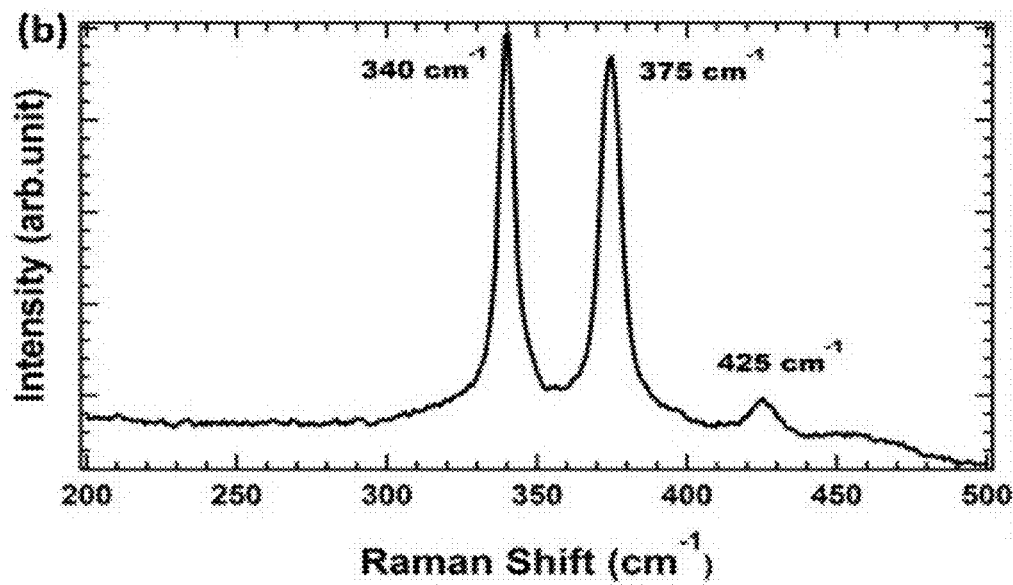
FIG. 6(b) is a plot of a Raman spectrum characterization of $FeS_2$ NC films deposited by LbL drop-cast method using NC of size ~70 nm for a film annealed at 540° C. for 1 hour.
Figure 6C:
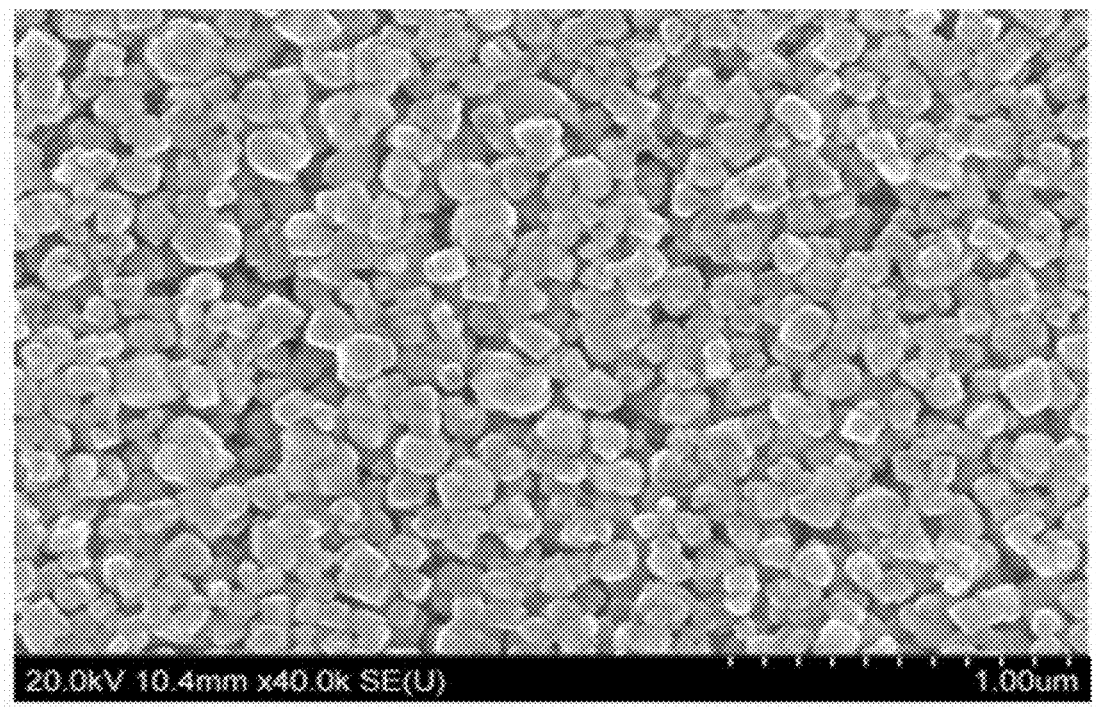
FIG. 6(c) is an SEM image for an as-deposited $FeS_2$ NC film deposited by LbL drop-cast method using NC of size ~70 nm film
Figure 6D:
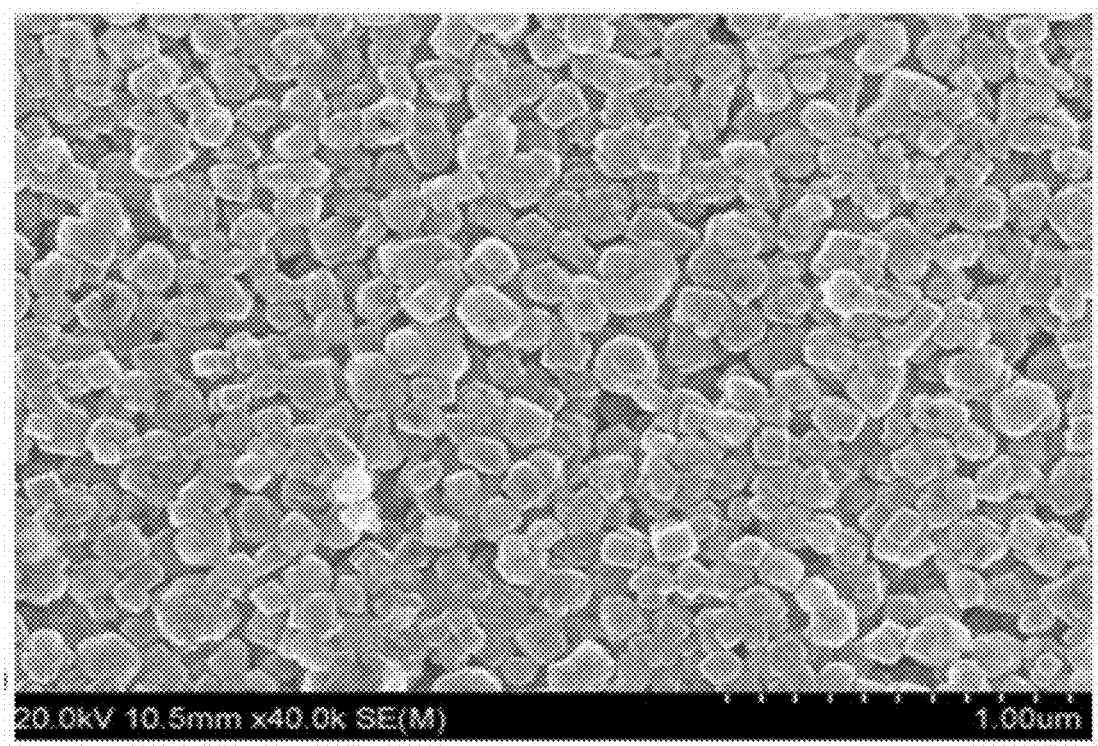
FIG. 6(d) is an SEM image for a $FeS_2$ NC film deposited by LbL drop-cast method using NC of size ~70 nm, the film treated in hydrazine and annealed at 540° C. for 3 hours.

When $FeS_2$ NC thin films are prepared by solution based methods, some pinholes were encountered. These pinholes are not completely removed by just increasing the thickness of the films. The inventors believe that removing these pinholes will increase cell performance by eliminating the potential for shunts within the semiconductor-to-contact interface. Several techniques have been used to reduce pinholes, which have been thought to be formed in response to the strain at the substrate-film interface, as well as the cooling action of the spray droplets and the differences in thermal expansion between pyrite and glass materials. The inventors believe, generally, that spray forming the films at a low rate or spray forming the films on the metal/glass substrate, instead of just the glass, may have a beneficial effect. In an embodiment of the method of forming photovoltaic cells having $FeS_2$-NC based back contacts, reducing pinhole effects begins with removing long chain C—H molecules from the surface of the NCs with hydrazine treatment. The NC film is sintered at a relatively high temperature. Though $FeS_2$ is thermodynamically unstable ($FeS_2$ converts to FeS) at high temperature over longer times, these NCs are stable when heated at low temperature for a short time interval. For higher temperature and longer time, the $FeS_2$-NC films are heated in sulfur vapor and in an argon atmosphere to prevent sulfur evaporation from $FeS_2$ and thus maintaining S/Fe ratio before and after heating. FIGS. 6(*a*)-6(*b*) show XRD spectra and SEM images of $FeS_2$ NC films before and after annealing. Raman spectroscopy is more sensitive than conventional XRD to explain the purity of the NC films before and after sulfur annealing. Raman spectra in FIG. 6(*b*) are sharper and more intense because of improved crystallinity of the film after annealing. Heating at 540° C. from one to three hours did not yield noticeable or appreciable grain growth of surface NCs on the films, as shown in FIG. 6(*d*). The XRD spectra in FIG. 6*a* show improvement in crystallinity after sintering. EDX spectral analysis further indicates that atomic percentage of S/Fe before and after annealing the film is maintained, indicating that the films were thermodynamically stable in the thermal sulfurization treatment.

In another aspect of thin film photovoltaic cells using iron pyrite based back contacts, the inventors have found that the these back contacts provide passivation of pinholes present in the semiconductor layers, similar to the pinholes of the back contact described above. Referring now to FIG. 14, there is illustrated a comparative plot of electrical performance of photovoltaic cells having semiconductor layers formed with pinholes utilizing standard and iron pyrite-based back contacts. Two sets of CdTe devices were prepared using standard (Cu/Au) and iron pyrite/gold ($FeS_2$NC/Au) back contacts and were left untreated for pinholes (passivation). Before back contact deposition, the CdS/CdTe thin films were treated normally with cadmium chloride. After the deposition of 3 nm Cu/40 nm Au, the standard sample was annealed at 150° C. for 45 minutes to diffuse copper (Cu) into the CdTe layer. In contrast, the iron pyrite back contact was prepared by depositing an $FeS_2$ NC film at room temperature and then thermally evaporating 40 nm Au to complete the device. For the standard back contact deposition, a shadow mask was used with an area of 0.08 cm². For the $FeS_2$ NC/Au sample, the back contact layer was scribed manually making an effective area of cell of 0.085 cm². Current density-voltage measurements were performed in 1 Sun illumination. As shown in FIG. 14, a plot of the strongest devices from each back contact configuration are presented. A summary of performance values for these samples and average values over a given population of devices are also shown.

As shown in the plot, the Cu/Au back contact device performed poorly, due to pin holes. These pinholes or areas of structural nonuniformity produce deleterious effects on cell performance by creating regions of weak diode behavior or regions of shunting. The pinholes or structural nonuniformities can result from either defects within various semiconductor layers of the device or from morphological irregularities in the deposition surface of the substrate material. In one instance, the pinholes may permit the Cu/Au contact material to migrate through to the CdS/CdTe semiconductor junction creating shunting pathways. This decreases VOC and the FF of the device even though JSC is still reasonably high. In contrast to the Cu/Au cell performance, when a 1 µm thick $FeS_2$ NC film was deposited by a solution based method, the film functioned both as a back contact and as a pinhole passivation or barrier. The increased VOC, FF and efficiency show the effectiveness of iron pyrite-based back contacts in passivating semiconductor pinholes.

While the invention has been described with reference to various embodiments, it should be understood by those skilled in the art that various changes may be made and equivalents may be substituted for elements thereof without departing from the essential scope of the invention. In addition, many modifications may be made to adapt a particular situation or material to the teachings of the invention without departing from the essential scope thereof.

Therefore, it is intended that the invention not be limited to the particular embodiment disclosed herein contemplated for carrying out this invention, but that the invention will include all embodiments falling within the scope of the claims.

What is claimed is:

1. A photovoltaic cell comprising:
    a front window comprising an n-type semiconductor material;
    a semiconductor layer comprising a p-type semiconductor material; and
    a back contact layer configured as an ohmic contact having an $FeS_2$ portion;
    wherein the $FeS_2$ portion is a nanocrystalline portion comprising a film of $FeS_2$ in a cubic phase; and
    wherein the $FeS_2$ portion comprises nanocrystals having an average size in a range of from about 70 nm to about 151 nm.

2. The photovoltaic cell of claim 1 wherein the $FeS_2$ portion is in direct contact with the semiconductor layer.

3. The photovoltaic cell of claim 1 wherein the semiconductor layer comprises CdTe and the front window comprises CdS.

4. The photovoltaic cell of claim 1 wherein a conductive material forms a portion of the back contact layer.

5. The photovoltaic cell of claim 4 wherein the $FeS_2$ portion is disposed between the semiconductor layer and the conductive material portion of the back contact layer.

6. The photovoltaic cell of claim 5 wherein the conductive material is one of Au, Cu, Sb, Hg, Bi-telluride, and graphene.

7. The photovoltaic cell of claim 4 wherein the conductive material is a first conductive material disposed between the semiconductor layer and the $FeS_2$ portion, and a second conductive material is disposed on an opposite side of the $FeS_2$ portion from the first conductive material.

8. The photovoltaic cell of claim 7 wherein the $FeS_2$ portion has a thickness in a range of about 5 nanometers to about 1500 nanometers.

9. The photovoltaic cell of claim 7 wherein one of the first and second conductive materials is Cu and other of the first and second conductive materials is Au.

10. The photovoltaic cell of claim 4 wherein the semiconductor layer includes at least one pinhole that permits a charge carrier dysfunction in an interface region of the semiconductor layer and the $FeS_2$ portion blocks the charge carrier dysfunction.

11. The photovoltaic cell of claim 10 wherein the conductive material is one of Au, Cu, Sb, Hg, Bi-telluride, and graphene.

12. The photovoltaic cell of claim 1 wherein the semiconductor layer includes one of CdTe, copper indium gallium di-selenide (CIGS), copper zinc tin sulfide (CZTS), copper zinc tin sulfur selenium alloy (CZTSSe), copper antimony sulfide, and tin sulfide.

13. The photovoltaic cell of claim 12 wherein a conductive material forms a portion of the back contact layer.

14. The photovoltaic cell of claim 13 wherein the conductive material is one of Au, Cu, Sb, Hg, Bi-telluride, and graphene.

15. The photovoltaic cell of claim 14 wherein the $FeS_2$ portion directly contacts the semiconductor layer, the semiconductor layer including at least one pinhole that permits a shunting effect at an interface region, wherein the $FeS_2$ portion blocks the shunting effect at the interface region.

16. A photovoltaic cell comprising:
    a transparent conductive layer permitting a portion of visible light to pass through and forming a first ohmic contact;
    a first active semiconductor layer having an n-type characteristic;
    a second active semiconductor layer having a p-type characteristic; and
    a back contact layer configured as a second ohmic contact having an $FeS_2$ portion, the back contact layer applied onto the second active semiconductor layer;
    wherein the $FeS_2$ portion is a nanocrystalline portion comprising a film of $FeS_2$ in a cubic phase; and
    wherein the $FeS_2$ portion comprises nanocrystals having an average size in a range of from about 70 nm to about 151 nm.

17. The photovoltaic cell of claim 16 wherein the transparent conductive layer includes a resistive coating layer, the first active semiconductor layer is a CdS layer, the second active semiconductor layer is a CdTe layer, and the back contact layer includes a conductive material.

18. The photovoltaic cell of claim 17 wherein the conductive material is one of Au, Cu, Sb, Hg, Bi-telluride, and graphene.

19. A photovoltaic cell comprising:
    a transparent conductive layer permitting a portion of visible light to pass through and forming a first ohmic contact;
    a CdS semiconductor layer having an n-type characteristic;
    a CdTe semiconductor layer having a p-type characteristic; and
    a back contact layer configured as a second ohmic contact, the back contact layer including a first conductive material applied onto the CdTe semiconductor layer, an $FeS_2$ nanocrystalline layer applied onto the first conductive material, and a second conductive material applied onto the $FeS_2$ nanocrystalline layer;
    wherein the $FeS_2$ nanocrystalline layer comprises a film of $FeS_2$ in a cubic phase; and
    wherein the $FeS_2$ nanocrystalline layer comprises nanocrystals having an average size in a range of from about 70 nm to about 151 nm.

20. The photovoltaic cell of claim 19 wherein the $FeS_2$ nanocrystalline layer is a ligand-free layer.

21. The photovoltaic cell of claim 1, wherein the film of $FeS_2$ has a thickness of greater than 1.5 microns.

\* \* \* \* \*